United States Patent
Ramdani et al.

(10) Patent No.: US 7,067,856 B2
(45) Date of Patent: Jun. 27, 2006

(54) SEMICONDUCTOR STRUCTURE, SEMICONDUCTOR DEVICE, COMMUNICATING DEVICE, INTEGRATED CIRCUIT, AND PROCESS FOR FABRICATING THE SAME

(75) Inventors: Jamal Ramdani, Gilbert, AZ (US); Ravindranath Droopad, Chandler, AZ (US); Lyndee L. Hilt, Chandler, AZ (US); Kurt Williamson Eisenbeiser, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/768,108

(22) Filed: Feb. 2, 2004

(65) Prior Publication Data

US 2004/0149203 A1  Aug. 5, 2004

Related U.S. Application Data

(62) Division of application No. 10/076,450, filed on Feb. 9, 2002, now abandoned, which is a division of application No. 09/502,023, filed on Feb. 10, 2000, now Pat. No. 6,392,257.

(51) Int. Cl.
  *H01L 31/072* (2006.01)
(52) U.S. Cl. .................. 257/190; 257/200; 257/201
(58) Field of Classification Search ............. 257/190, 257/200, 201
  See application file for complete search history.

(56) References Cited

U.S. PATENT DOCUMENTS

| | | | |
|---|---|---|---|
| 3,617,951 A | 11/1971 | Anderson | |
| 3,670,213 A | 6/1972 | Nakagawa et al. | |
| 3,758,199 A | 9/1973 | Thaxter | |
| 3,766,370 A | 10/1973 | Walther | |
| 3,802,967 A | 4/1974 | Ladany et al. | |
| 3,818,451 A | 6/1974 | Coleman | |
| 3,914,137 A | 10/1975 | Huffman et al. | |
| 3,935,031 A | 1/1976 | Adler | |
| 4,006,989 A | 2/1977 | Andringa | |

(Continued)

FOREIGN PATENT DOCUMENTS

DE    196 07 107    8/1997

(Continued)

OTHER PUBLICATIONS

Kaushik et al., "Device Characteristics of Crystalline Epitaxial Oxides on Silicon," Device Research Conference, 2000, Conference Digest 58th DRC, pp. 17-20, Jun. 19-21, 2000.*

(Continued)

*Primary Examiner*—Richard A. Booth
(74) *Attorney, Agent, or Firm*—Oblon, Spivak, McClelland, Maier & Neustadt, P.C.

(57) ABSTRACT

High quality epitaxial layers of compound semiconductor materials can be grown overlying large silicon wafers by first growing an accommodating buffer layer on a silicon wafer. The accommodating buffer layer is a layer of monocrystalline oxide spaced apart from the silicon wafer by an amorphous interface layer of silicon oxide. The amorphous interface layer dissipates strain and permits the growth of a high quality monocrystalline oxide accommodating buffer layer. The accommodating buffer layer is lattice matched to both the underlying silicon wafer and the overlying monocrystalline compound semiconductor layer. Any lattice mismatch between the accommodating buffer layer and the underlying silicon substrate is taken care of by the amorphous interface layer.

9 Claims, 8 Drawing Sheets

U.S. PATENT DOCUMENTS

| | | |
|---|---|---|
| 4,084,130 A | 4/1978 | Holton |
| 4,120,588 A | 10/1978 | Chaum |
| 4,146,297 A | 3/1979 | Alferness et al. |
| 4,174,422 A | 11/1979 | Matthews et al. |
| 4,174,504 A | 11/1979 | Chenausky et al. |
| 4,177,094 A | 12/1979 | Kroon |
| 4,242,595 A | 12/1980 | Lehovec |
| 4,284,329 A | 8/1981 | Smith et al. |
| 4,289,920 A | 9/1981 | Hovel |
| 4,297,656 A | 10/1981 | Pan |
| 4,298,247 A | 11/1981 | Michelet et al. |
| 4,378,259 A | 3/1983 | Hasegawa et al. |
| 4,392,297 A | 7/1983 | Little |
| 4,398,342 A | 8/1983 | Pitt et al. |
| 4,404,265 A | 9/1983 | Manasevit |
| 4,424,589 A | 1/1984 | Thomas et al. |
| 4,439,014 A | 3/1984 | Stacy et al. |
| 4,442,590 A | 4/1984 | Stockton et al. |
| 4,447,116 A | 5/1984 | King et al. |
| 4,452,720 A | 6/1984 | Harada et al. |
| 4,459,325 A | 7/1984 | Nozawa et al. |
| 4,482,422 A | 11/1984 | McGinn et al. |
| 4,482,906 A | 11/1984 | Hovel et al. |
| 4,484,332 A | 11/1984 | Hawrylo |
| 4,503,540 A | 3/1985 | Nakashima et al. |
| 4,523,211 A | 6/1985 | Morimoto et al. |
| 4,525,871 A | 6/1985 | Foyt et al. |
| 4,594,000 A | 6/1986 | Falk et al. |
| 4,626,878 A | 12/1986 | Kuwano et al. |
| 4,629,821 A | 12/1986 | Bronstein-Bonte et al. |
| 4,661,176 A | 4/1987 | Manasevit |
| 4,667,088 A | 5/1987 | Kramer |
| 4,667,212 A | 5/1987 | Nakamura |
| 4,681,982 A | 7/1987 | Yoshida |
| 4,695,120 A | 9/1987 | Holder |
| 4,723,321 A | 2/1988 | Saleh |
| 4,748,485 A | 5/1988 | Vasudev |
| 4,756,007 A | 7/1988 | Qureshi et al. |
| 4,772,929 A | 9/1988 | Manchester et al. |
| 4,773,063 A | 9/1988 | Hunsperger et al. |
| 4,774,205 A | 9/1988 | Choi et al. |
| 4,777,613 A | 10/1988 | Shahan et al. |
| 4,793,872 A | 12/1988 | Meunier et al. |
| 4,801,184 A | 1/1989 | Revelli |
| 4,802,182 A | 1/1989 | Thornton et al. |
| 4,804,866 A | 2/1989 | Akiyama |
| 4,815,084 A | 3/1989 | Scifres et al. |
| 4,841,775 A | 6/1989 | Ikeda et al. |
| 4,843,609 A | 6/1989 | Ohya et al. |
| 4,845,044 A | 7/1989 | Ariyoshi et al. |
| 4,846,926 A | 7/1989 | Kay et al. |
| 4,855,249 A | 8/1989 | Akasaki et al. |
| 4,866,489 A | 9/1989 | Yokogawa et al. |
| 4,868,376 A | 9/1989 | Lessin et al. |
| 4,872,046 A | 10/1989 | Morkoc et al. |
| 4,876,208 A | 10/1989 | Gustafson et al. |
| 4,876,218 A | 10/1989 | Pessa et al. |
| 4,876,219 A | 10/1989 | Eshita et al. |
| 4,882,300 A | 11/1989 | Inoue et al. |
| 4,885,376 A | 12/1989 | Verkade |
| 4,888,202 A | 12/1989 | Murakami et al. |
| 4,889,402 A | 12/1989 | Reinhart |
| 4,891,091 A | 1/1990 | Shastry |
| 4,896,194 A | 1/1990 | Suzuki |
| 4,901,133 A | 2/1990 | Curran et al. |
| 4,910,164 A | 3/1990 | Shichijo |
| 4,912,087 A | 3/1990 | Aslam et al. |
| 4,928,154 A | 5/1990 | Umeno et al. |
| 4,934,777 A | 6/1990 | Jou et al. |
| 4,952,420 A | 8/1990 | Walters |
| 4,959,702 A | 9/1990 | Moyer et al. |
| 4,963,508 A | 10/1990 | Umeno et al. |
| 4,963,949 A | 10/1990 | Wanlass et al. |
| 4,965,649 A | 10/1990 | Zanio et al. |
| 4,981,714 A | 1/1991 | Ohno et al. |
| 4,984,043 A | 1/1991 | Vinal |
| 4,999,842 A | 3/1991 | Huang et al. |
| 5,018,816 A | 5/1991 | Murray et al. |
| 5,028,563 A | 7/1991 | Feit et al. |
| 5,028,976 A | 7/1991 | Ozaki et al. |
| 5,051,790 A | 9/1991 | Hammer |
| 5,053,835 A | 10/1991 | Horikawa et al. |
| 5,055,445 A | 10/1991 | Belt et al. |
| 5,055,835 A | 10/1991 | Sutton |
| 5,057,694 A | 10/1991 | Idaka et al. |
| 5,060,031 A | 10/1991 | Abrokwah et al. |
| 5,063,081 A | 11/1991 | Cozzette et al. |
| 5,063,166 A | 11/1991 | Mooney et al. |
| 5,064,781 A | 11/1991 | Cambou et al. |
| 5,067,809 A | 11/1991 | Tsubota |
| 5,073,981 A | 12/1991 | Giles et al. |
| 5,075,743 A | 12/1991 | Behfar-Rad |
| 5,081,062 A | 1/1992 | Vasudev et al. |
| 5,081,519 A | 1/1992 | Nishimura |
| 5,087,829 A | 2/1992 | Ishibashi et al. |
| 5,103,494 A | 4/1992 | Mozer |
| 5,116,461 A | 5/1992 | Lebby et al. |
| 5,119,448 A | 6/1992 | Schaefer et al. |
| 5,122,679 A | 6/1992 | Ishii et al. |
| 5,122,852 A | 6/1992 | Chan et al. |
| 5,127,067 A | 6/1992 | Delcoco et al. |
| 5,130,762 A | 7/1992 | Kulick |
| 5,132,648 A | 7/1992 | Trinh et al. |
| 5,140,387 A | 8/1992 | Okazaki et al. |
| 5,140,651 A | 8/1992 | Soref et al. |
| 5,141,894 A | 8/1992 | Bisaro et al. |
| 5,143,854 A | 9/1992 | Pirrung et al. |
| 5,144,409 A | 9/1992 | Ma |
| 5,148,504 A | 9/1992 | Levi et al. |
| 5,155,658 A | 10/1992 | Inam et al. |
| 5,159,413 A | 10/1992 | Calviello et al. |
| 5,163,118 A | 11/1992 | Lorenzo et al. |
| 5,166,761 A | 11/1992 | Olson et al. |
| 5,173,474 A | 12/1992 | Connell et al. |
| 5,173,835 A | 12/1992 | Cornett et al. |
| 5,181,085 A | 1/1993 | Moon et al. |
| 5,185,589 A | 2/1993 | Krishnaswamy et al. |
| 5,188,976 A | 2/1993 | Kume et al. |
| 5,191,625 A | 3/1993 | Gustavsson |
| 5,194,397 A | 3/1993 | Cook et al. |
| 5,194,917 A | 3/1993 | Regener |
| 5,198,269 A | 3/1993 | Swartz et al. |
| 5,208,182 A | 5/1993 | Narayan et al. |
| 5,210,763 A | 5/1993 | Lewis et al. |
| 5,216,359 A | 6/1993 | Makki et al. |
| 5,216,729 A | 6/1993 | Berger et al. |
| 5,221,367 A | 6/1993 | Chisholm et al. |
| 5,225,031 A | 7/1993 | McKee et al. |
| 5,227,196 A | 7/1993 | Itoh |
| 5,238,877 A | 8/1993 | Russell |
| 5,244,818 A | 9/1993 | Jokers et al. |
| 5,248,564 A | 9/1993 | Ramesh |
| 5,260,394 A | 11/1993 | Tazaki et al. |
| 5,262,659 A | 11/1993 | Grudkowski et al. |
| 5,266,355 A | 11/1993 | Wernberg et al. |
| 5,268,327 A | 12/1993 | Vernon |
| 5,270,298 A | 12/1993 | Ramesh |
| 5,280,013 A | 1/1994 | Newman et al. |
| 5,281,834 A | 1/1994 | Cambou et al. |
| 5,283,462 A | 2/1994 | Stengel |
| 5,286,985 A | 2/1994 | Taddiken |
| 5,293,050 A | 3/1994 | Chapple-Sokol et al. |
| 5,306,649 A | 4/1994 | Hebert |
| 5,310,707 A | 5/1994 | Oishi et al. |

| | | | | | |
|---|---|---|---|---|---|
| 5,312,765 A | 5/1994 | Kanber | 5,528,057 A | 6/1996 | Yanagase et al. |
| 5,313,058 A | 5/1994 | Friederich et al. | 5,528,067 A | 6/1996 | Farb et al. |
| 5,314,547 A | 5/1994 | Heremans et al. | 5,528,209 A | 6/1996 | Macdonald et al. |
| 5,315,128 A | 5/1994 | Hunt et al. | 5,528,414 A | 6/1996 | Oakley |
| 5,323,023 A | 6/1994 | Fork | 5,530,235 A | 6/1996 | Stefik et al. |
| 5,326,721 A | 7/1994 | Summerfelt | 5,538,941 A | 7/1996 | Findikoglu et al. |
| 5,334,556 A | 8/1994 | Guldi | 5,540,785 A | 7/1996 | Dennard et al. |
| 5,352,926 A | 10/1994 | Andrews | 5,541,422 A | 7/1996 | Wolf et al. |
| 5,356,509 A | 10/1994 | Terranova et al. | 5,548,141 A | 8/1996 | Morris et al. |
| 5,356,831 A | 10/1994 | Calviello et al. | 5,549,977 A | 8/1996 | Jin et al. |
| 5,357,122 A | 10/1994 | Okubora et al. | 5,551,238 A | 9/1996 | Prueitt |
| 5,358,925 A | 10/1994 | Neville Connell et al. | 5,552,547 A | 9/1996 | Shi |
| 5,362,972 A | 11/1994 | Yazawa et al. | 5,553,089 A | 9/1996 | Seki et al. |
| 5,362,998 A | 11/1994 | Iwamura et al. | 5,556,463 A | 9/1996 | Guenzer |
| 5,365,477 A | 11/1994 | Cooper, Jr. et al. | 5,559,368 A | 9/1996 | Hu et al. |
| 5,371,621 A | 12/1994 | Stevens | 5,561,305 A | 10/1996 | Smith |
| 5,371,734 A | 12/1994 | Fischer | 5,569,953 A | 10/1996 | Kikkawa et al. |
| 5,372,992 A | 12/1994 | Itozaki et al. | 5,570,226 A | 10/1996 | Ota |
| 5,373,166 A | 12/1994 | Buchan et al. | 5,572,052 A | 11/1996 | Kashihara et al. |
| 5,387,811 A | 2/1995 | Saigoh | 5,574,296 A | 11/1996 | Park et al. |
| 5,391,515 A | 2/1995 | Kao et al. | 5,574,589 A | 11/1996 | Feuer et al. |
| 5,393,352 A | 2/1995 | Summerfelt | 5,574,744 A | 11/1996 | Gaw et al. |
| 5,394,489 A | 2/1995 | Koch | 5,576,879 A | 11/1996 | Nashimoto |
| 5,395,663 A | 3/1995 | Tabata et al. | 5,578,162 A | 11/1996 | D'Asaro et al. |
| 5,397,428 A | 3/1995 | Stoner et al. | 5,585,167 A | 12/1996 | Satoh et al. |
| 5,399,898 A | 3/1995 | Rostoker | 5,585,288 A | 12/1996 | Davis et al. |
| 5,404,581 A | 4/1995 | Honjo | 5,588,995 A | 12/1996 | Sheldon |
| 5,405,802 A | 4/1995 | Yamagata et al. | 5,589,284 A | 12/1996 | Summerfelt et al. |
| 5,406,202 A | 4/1995 | Mehrgardt et al. | 5,596,205 A | 1/1997 | Reedy et al. |
| 5,410,622 A | 4/1995 | Okada et al. | 5,596,214 A | 1/1997 | Endo |
| 5,418,216 A | 5/1995 | Fork | 5,602,418 A | 2/1997 | Imai et al. |
| 5,418,389 A | 5/1995 | Watanabe | 5,603,764 A | 2/1997 | Matsuda et al. |
| 5,420,102 A | 5/1995 | Harshavardhan et al. | 5,606,184 A | 2/1997 | Abrokwah et al. |
| 5,427,988 A | 6/1995 | Sengupta et al. | 5,608,046 A | 3/1997 | Cook et al. |
| 5,430,397 A | 7/1995 | Itoh et al. | 5,610,744 A | 3/1997 | Ho et al. |
| 5,436,759 A | 7/1995 | Dijaii et al. | 5,614,739 A | 3/1997 | Abrokwah et al. |
| 5,438,584 A | 8/1995 | Paoli et al. | 5,619,051 A | 4/1997 | Endo |
| 5,441,577 A | 8/1995 | Sasaki et al. | 5,621,227 A | 4/1997 | Joshi |
| 5,442,191 A | 8/1995 | Ma | 5,623,439 A | 4/1997 | Gotoh et al. |
| 5,442,561 A | 8/1995 | Yoshizawa et al. | 5,623,552 A | 4/1997 | Lane |
| 5,444,016 A | 8/1995 | Abrokwah et al. | 5,629,534 A | 5/1997 | Inuzuka et al. |
| 5,446,719 A | 8/1995 | Yoshida et al. | 5,633,724 A | 5/1997 | King et al. |
| 5,450,812 A | 9/1995 | McKee et al. | 5,635,433 A | 6/1997 | Sengupta |
| 5,452,118 A | 9/1995 | Maruska | 5,635,453 A | 6/1997 | Pique et al. |
| 5,453,727 A | 9/1995 | Shibasaki et al. | 5,640,267 A | 6/1997 | May et al. |
| 5,466,631 A | 11/1995 | Ichikawa et al. | 5,642,371 A | 6/1997 | Tohyama et al. |
| 5,473,047 A | 12/1995 | Shi | 5,650,646 A | 7/1997 | Summerfelt |
| 5,473,171 A | 12/1995 | Summerfelt | 5,656,382 A | 8/1997 | Nashimoto |
| 5,477,363 A | 12/1995 | Matsuda | 5,659,180 A | 8/1997 | Shen et al. |
| 5,478,653 A * | 12/1995 | Guenzer .................. 428/446 | 5,661,112 A | 8/1997 | Hatta et al. |
| 5,479,033 A | 12/1995 | Baca et al. | 5,666,376 A | 9/1997 | Cheng |
| 5,479,317 A | 12/1995 | Ramesh | 5,667,586 A | 9/1997 | Ek et al. |
| 5,480,829 A | 1/1996 | Abrokwah et al. | 5,668,048 A | 9/1997 | Kondo et al. |
| 5,481,102 A | 1/1996 | Hazelrigg, Jr. | 5,670,798 A | 9/1997 | Schetzina |
| 5,482,003 A | 1/1996 | McKee et al. | 5,670,800 A | 9/1997 | Nakao et al. |
| 5,484,664 A | 1/1996 | Kitahara et al. | 5,674,366 A | 10/1997 | Hayashi et al. |
| 5,486,406 A | 1/1996 | Shi | 5,674,813 A | 10/1997 | Nakamura et al. |
| 5,491,461 A | 2/1996 | Partin et al. | 5,679,947 A | 10/1997 | Doi et al. |
| 5,492,859 A | 2/1996 | Sakaguchi et al. | 5,679,965 A | 10/1997 | Schetzina |
| 5,494,711 A | 2/1996 | Takeda et al. | 5,682,046 A | 10/1997 | Takahashi et al. |
| 5,504,035 A | 4/1996 | Rostoker et al. | 5,684,302 A | 11/1997 | Wersing et al. |
| 5,504,183 A | 4/1996 | Shi | 5,686,741 A | 11/1997 | Ohori et al. |
| 5,508,554 A | 4/1996 | Takatani et al. | 5,689,123 A | 11/1997 | Major et al. |
| 5,510,665 A | 4/1996 | Conley | 5,693,140 A | 12/1997 | McKee et al. |
| 5,511,238 A | 4/1996 | Bayraktaroglu | 5,696,392 A | 12/1997 | Char et al. |
| 5,512,773 A | 4/1996 | Wolf et al. | 5,719,417 A | 2/1998 | Roeder et al. |
| 5,514,484 A | 5/1996 | Nashimoto | 5,725,641 A | 3/1998 | MacLeod |
| 5,514,904 A | 5/1996 | Onga et al. | 5,729,394 A | 3/1998 | Sevier et al. |
| 5,515,047 A | 5/1996 | Yamakido et al. | 5,729,641 A | 3/1998 | Chandonnet et al. |
| 5,515,810 A | 5/1996 | Yamashita et al. | 5,731,220 A | 3/1998 | Tsu et al. |
| 5,516,725 A | 5/1996 | Chang et al. | 5,733,641 A | 3/1998 | Fork et al. |
| 5,519,235 A | 5/1996 | Ramesh | 5,734,672 A | 3/1998 | McMinn et al. |
| 5,523,602 A | 6/1996 | Horiuchi et al. | 5,735,949 A | 4/1998 | Mantl et al. |

| | | | | | |
|---|---|---|---|---|---|
| 5,741,724 A | 4/1998 | Ramdani et al. | 5,937,274 A | 8/1999 | Kondow et al. |
| 5,745,631 A | 4/1998 | Reinker | 5,937,285 A | 8/1999 | Abrokwah et al. |
| 5,753,300 A | 5/1998 | Wessels et al. | 5,948,161 A | 9/1999 | Kizuki |
| 5,753,928 A | 5/1998 | Krause | 5,953,468 A | 9/1999 | Finnila et al. |
| 5,753,934 A | 5/1998 | Yano et al. | 5,955,591 A | 9/1999 | Imbach et al. |
| 5,754,319 A | 5/1998 | Van De Voorde et al. | 5,959,308 A | 9/1999 | Shichijo et al. |
| 5,754,714 A | 5/1998 | Suzuki et al. | 5,959,879 A | 9/1999 | Koo |
| 5,760,426 A | 6/1998 | Marx et al. | 5,962,069 A | 10/1999 | Schindler et al. |
| 5,760,427 A | 6/1998 | Onda | 5,963,291 A | 10/1999 | Wu et al. |
| 5,760,740 A | 6/1998 | Blodgett | 5,966,323 A | 10/1999 | Chen et al. |
| 5,764,676 A | 6/1998 | Paoli et al. | 5,976,953 A | 11/1999 | Zavracky et al. |
| 5,767,543 A | 6/1998 | Ooms et al. | 5,977,567 A | 11/1999 | Verdiell |
| 5,770,887 A | 6/1998 | Tadatomo et al. | 5,981,400 A | 11/1999 | Lo |
| 5,772,758 A | 6/1998 | Collins et al. | 5,981,976 A | 11/1999 | Murasato |
| 5,776,359 A | 7/1998 | Schultz et al. | 5,981,980 A | 11/1999 | Miyajima et al. |
| 5,776,621 A | 7/1998 | Nashimoto | 5,984,190 A | 11/1999 | Nevill |
| 5,777,350 A | 7/1998 | Nakamura et al. | 5,985,404 A | 11/1999 | Yano et al. |
| 5,777,762 A | 7/1998 | Yamamoto | 5,986,301 A | 11/1999 | Fukushima et al. |
| 5,778,018 A | 7/1998 | Yoshikawa et al. | 5,987,011 A | 11/1999 | Toh |
| 5,778,116 A | 7/1998 | Tomich | 5,987,196 A | 11/1999 | Noble |
| 5,780,311 A | 7/1998 | Beasom et al. | 5,990,495 A | 11/1999 | Ohba |
| 5,789,733 A | 8/1998 | Jachimowicz et al. | 5,995,359 A | 11/1999 | Klee et al. |
| 5,789,845 A | 8/1998 | Wadaka et al. | 5,995,528 A | 11/1999 | Fukunaga et al. |
| 5,790,583 A | 8/1998 | Ho | 5,997,638 A | 12/1999 | Copel et al. |
| 5,792,569 A | 8/1998 | Sun et al. | 5,998,781 A | 12/1999 | Vawter et al. |
| 5,792,679 A | 8/1998 | Nakato | 5,998,819 A | 12/1999 | Yokoyama et al. |
| 5,796,648 A | 8/1998 | Kawakubo et al. | 6,002,375 A | 12/1999 | Corman et al. |
| 5,801,072 A | 9/1998 | Barber | 6,008,762 A | 12/1999 | Nghiem |
| 5,801,105 A | 9/1998 | Yano et al. | 6,011,641 A | 1/2000 | Shin et al. |
| 5,807,440 A | 9/1998 | Kubota et al. | 6,011,646 A | 1/2000 | Mirkarimi et al. |
| 5,810,923 A | 9/1998 | Yano et al. | 6,013,553 A | 1/2000 | Wallace et al. |
| 5,812,272 A | 9/1998 | King et al. | 6,020,222 A | 2/2000 | Wollesen |
| 5,814,583 A | 9/1998 | Itozaki et al. | 6,022,140 A | 2/2000 | Fraden et al. |
| 5,825,055 A | 10/1998 | Summerfelt | 6,022,410 A | 2/2000 | Yu et al. |
| 5,825,799 A | 10/1998 | Ho et al. | 6,022,671 A | 2/2000 | Binkley et al. |
| 5,827,755 A | 10/1998 | Yonchara et al. | 6,022,963 A | 2/2000 | McGall et al. |
| 5,828,080 A | 10/1998 | Yano et al. | 6,023,082 A | 2/2000 | McKee et al. |
| 5,830,270 A | 11/1998 | McKee et al. | 6,028,853 A | 2/2000 | Haartsen |
| 5,831,960 A | 11/1998 | Jiang et al. | 6,039,803 A | 3/2000 | Fitzgerald et al. |
| 5,833,603 A | 11/1998 | Kovacs et al. | 6,045,626 A | 4/2000 | Yano et al. |
| 5,834,362 A | 11/1998 | Miyagaki et al. | 6,046,464 A | 4/2000 | Schetzina |
| 5,838,035 A | 11/1998 | Ramesh | 6,048,751 A | 4/2000 | D'Asaro et al. |
| 5,838,053 A | 11/1998 | Bevan et al. | 6,049,110 A | 4/2000 | Koh |
| 5,844,260 A | 12/1998 | Ohori | 6,049,702 A | 4/2000 | Tham et al. |
| 5,846,846 A | 12/1998 | Suh et al. | 6,051,858 A | 4/2000 | Uchida et al. |
| 5,852,687 A | 12/1998 | Wickham | 6,051,874 A | 4/2000 | Masuda |
| 5,857,049 A | 1/1999 | Beranek et al. | 6,055,179 A | 4/2000 | Koganei et al. |
| 5,858,814 A | 1/1999 | Goossen et al. | 6,058,131 A | 5/2000 | Pan |
| 5,861,966 A | 1/1999 | Ortel | 6,059,895 A | 5/2000 | Chu et al. |
| 5,863,326 A | 1/1999 | Nause et al. | 6,064,078 A | 5/2000 | Northrup et al. |
| 5,864,171 A | 1/1999 | Yamamoto et al. | 6,064,092 A | 5/2000 | Park |
| 5,869,845 A | 2/1999 | Vander Wagt et al. | 6,064,783 A | 5/2000 | Congdon et al. |
| 5,872,493 A | 2/1999 | Ella | 6,078,717 A | 6/2000 | Nashimoto et al. |
| 5,873,977 A | 2/1999 | Desu et al. | 6,080,378 A | 6/2000 | Yokota et al. |
| 5,874,860 A | 2/1999 | Brunel et al. | 6,083,697 A | 7/2000 | Beecher et al. |
| 5,878,175 A | 3/1999 | Sonoda et al. | 6,087,681 A | 7/2000 | Shakuda |
| 5,879,956 A | 3/1999 | Seon et al. | 6,088,216 A | 7/2000 | Laibowitz et al. |
| 5,880,452 A | 3/1999 | Plesko | 6,090,659 A | 7/2000 | Laibowitz et al. |
| 5,882,948 A | 3/1999 | Jewell | 6,093,302 A | 7/2000 | Montgomery |
| 5,883,564 A | 3/1999 | Partin | 6,096,584 A | 8/2000 | Ellis-Monaghan et al. |
| 5,883,996 A | 3/1999 | Knapp et al. | 6,100,578 A | 8/2000 | Suzuki |
| 5,886,867 A | 3/1999 | Chivukula et al. | 6,103,008 A | 8/2000 | McKee et al. |
| 5,888,296 A | 3/1999 | Ooms et al. | 6,103,403 A | 8/2000 | Grigorian et al. |
| 5,889,296 A | 3/1999 | Imamura et al. | 6,107,653 A | 8/2000 | Fitzgerald |
| 5,896,476 A | 4/1999 | Wisseman et al. | 6,107,721 A | 8/2000 | Lakin |
| 5,905,571 A | 5/1999 | Butler et al. | 6,108,125 A | 8/2000 | Yano |
| 5,907,792 A | 5/1999 | Droopad et al. | 6,110,813 A | 8/2000 | Ota et al. |
| 5,912,068 A | 6/1999 | Jia | 6,110,840 A | 8/2000 | Yu |
| 5,919,515 A | 7/1999 | Yano et al. | 6,113,225 A | 9/2000 | Miyata et al. |
| 5,919,522 A | 7/1999 | Baum et al. | 6,113,690 A | 9/2000 | Yu et al. |
| 5,926,493 A | 7/1999 | O'Brien et al. | 6,114,996 A | 9/2000 | Nghiem |
| 5,926,496 A | 7/1999 | Ho et al. | 6,121,642 A | 9/2000 | Newns |
| 5,937,115 A | 8/1999 | Domash | 6,121,647 A | 9/2000 | Yano et al. |

| | | |
|---|---|---|
| 6,128,178 A | 10/2000 | Newns |
| 6,134,114 A | 10/2000 | Ungermann et al. |
| 6,136,666 A | 10/2000 | So |
| 6,137,603 A | 10/2000 | Henmi |
| 6,139,483 A | 10/2000 | Seabaugh et al. |
| 6,140,746 A | 10/2000 | Miyashita et al. |
| 6,143,072 A | 11/2000 | McKee et al. |
| 6,143,366 A | 11/2000 | Lu |
| 6,146,906 A | 11/2000 | Inoue et al. |
| 6,150,239 A | 11/2000 | Goesele et al. |
| 6,151,240 A | 11/2000 | Suzuki |
| 6,153,010 A | 11/2000 | Kiyoku et al. |
| 6,153,454 A | 11/2000 | Krivokapic |
| 6,156,581 A | 12/2000 | Vaudo et al. |
| 6,173,474 B1 | 1/2001 | Conrad |
| 6,174,755 B1 | 1/2001 | Manning |
| 6,175,497 B1 | 1/2001 | Tseng et al. |
| 6,175,555 B1 | 1/2001 | Hoole |
| 6,180,252 B1 | 1/2001 | Farrell et al. |
| 6,180,486 B1 | 1/2001 | Leobandung et al. |
| 6,181,920 B1 | 1/2001 | Dent et al. |
| 6,184,044 B1 | 2/2001 | Sone et al. |
| 6,184,144 B1 | 2/2001 | Lo |
| 6,191,011 B1 | 2/2001 | Gilboa et al. |
| 6,194,753 B1 | 2/2001 | Seon et al. |
| 6,197,503 B1 | 3/2001 | Vo-Dinh et al. |
| 6,198,119 B1 | 3/2001 | Nabatame et al. |
| 6,204,525 B1 | 3/2001 | Sakurai et al. |
| 6,204,737 B1 | 3/2001 | Ella |
| 6,208,453 B1 | 3/2001 | Wessels et al. |
| 6,210,988 B1 | 4/2001 | Howe et al. |
| 6,211,096 B1 | 4/2001 | Allman et al. |
| 6,222,654 B1 | 4/2001 | Frigo |
| 6,224,669 B1 | 5/2001 | Yi et al. |
| 6,225,051 B1 | 5/2001 | Sugiyama et al. |
| 6,229,159 B1 | 5/2001 | Suzuki |
| 6,232,242 B1 | 5/2001 | Hata et al. |
| 6,232,806 B1 | 5/2001 | Woeste et al. |
| 6,232,910 B1 | 5/2001 | Bell et al. |
| 6,233,435 B1 | 5/2001 | Wong |
| 6,235,145 B1 | 5/2001 | Li et al. |
| 6,235,649 B1 | 5/2001 | Kawahara et al. |
| 6,238,946 B1 | 5/2001 | Ziegler |
| 6,239,012 B1 | 5/2001 | Kinsman |
| 6,239,449 B1 | 5/2001 | Fafard et al. |
| 6,241,821 B1 | 6/2001 | Yu et al. |
| 6,242,686 B1 | 6/2001 | Kishimoto et al. |
| 6,248,459 B1 | 6/2001 | Wang et al. |
| 6,248,621 B1 | 6/2001 | Wilk et al. |
| 6,252,261 B1 | 6/2001 | Usui et al. |
| 6,255,198 B1 | 7/2001 | Linthicum et al. |
| 6,256,426 B1 | 7/2001 | Duchet |
| 6,265,749 B1 | 7/2001 | Gardner et al. |
| 6,268,269 B1 | 7/2001 | Lee et al. |
| 6,271,619 B1 | 8/2001 | Yamada et al. |
| 6,275,122 B1 | 8/2001 | Speidell et al. |
| 6,277,436 B1 | 8/2001 | Stauf et al. |
| 6,278,137 B1 | 8/2001 | Shimoyama et al. |
| 6,278,138 B1 | 8/2001 | Suzuki |
| 6,278,523 B1 | 8/2001 | Gorecki |
| 6,278,541 B1 | 8/2001 | Baker |
| 6,291,319 B1 | 9/2001 | Yu et al. |
| 6,291,866 B1 | 9/2001 | Wallace |
| 6,297,598 B1 | 10/2001 | Wang et al. |
| 6,297,842 B1 | 10/2001 | Koizumi et al. |
| 6,300,615 B1 | 10/2001 | Shinohara et al. |
| 6,306,668 B1 | 10/2001 | McKee et al. |
| 6,307,996 B1 | 10/2001 | Nashimoto et al. |
| 6,312,819 B1 | 11/2001 | Jia et al. |
| 6,313,486 B1 | 11/2001 | Kencke et al. |
| 6,316,785 B1 | 11/2001 | Nunoue et al. |
| 6,316,832 B1 | 11/2001 | Tsuzuki et al. |
| 6,319,730 B1 | 11/2001 | Ramdani et al. |
| 6,320,238 B1 | 11/2001 | Kizilyalli et al. |
| 6,326,637 B1 | 12/2001 | Parkin et al. |
| 6,326,645 B1 | 12/2001 | Kadota |
| 6,326,667 B1 | 12/2001 | Sugiyama et al. |
| 6,329,277 B1 | 12/2001 | Liu et al. |
| 6,338,756 B1 | 1/2002 | Dietze |
| 6,339,664 B1 | 1/2002 | Farjady et al. |
| 6,340,788 B1 | 1/2002 | King et al. |
| 6,341,851 B1 | 1/2002 | Takayama et al. |
| 6,343,171 B1 | 1/2002 | Yoshimura et al. |
| 6,345,424 B1 | 2/2002 | Hasegawa et al. |
| 6,348,373 B1 | 2/2002 | Ma et al. |
| 6,355,945 B1 | 3/2002 | Kadota et al. |
| 6,359,330 B1 | 3/2002 | Goudard |
| 6,362,017 B1 | 3/2002 | Manabe et al. |
| 6,362,558 B1 | 3/2002 | Fukui |
| 6,367,699 B1 | 4/2002 | Ackley |
| 6,372,356 B1 | 4/2002 | Thornton et al. |
| 6,372,813 B1 | 4/2002 | Johnson et al. |
| 6,376,337 B1 | 4/2002 | Wang et al. |
| 6,389,209 B1 | 5/2002 | Suhir |
| 6,391,674 B1 | 5/2002 | Ziegler |
| 6,392,253 B1 | 5/2002 | Saxena |
| 6,392,257 B1 | 5/2002 | Ramdani et al. |
| 6,393,167 B1 | 5/2002 | Davis et al. |
| 6,404,027 B1 | 6/2002 | Hong et al. |
| 6,410,941 B1 | 6/2002 | Taylor et al. |
| 6,410,947 B1 | 6/2002 | Wada |
| 6,411,756 B1 | 6/2002 | Sadot et al. |
| 6,415,140 B1 | 7/2002 | Benjamin et al. |
| 6,417,059 B1 | 7/2002 | Huang |
| 6,419,849 B1 | 7/2002 | Qiu et al. |
| 6,427,066 B1 | 7/2002 | Grube |
| 6,432,546 B1 | 8/2002 | Ramesh et al. |
| 6,438,281 B1 | 8/2002 | Tsukamoto et al. |
| 6,445,724 B1 | 9/2002 | Abeles |
| 6,452,232 B1 | 9/2002 | Adan |
| 6,461,927 B1 | 10/2002 | Mochizuki et al. |
| 6,462,360 B1 | 10/2002 | Higgins, Jr. et al. |
| 6,477,285 B1 | 11/2002 | Shanley |
| 6,496,469 B1 | 12/2002 | Uchizaki |
| 6,498,358 B1 | 12/2002 | Lach et al. |
| 6,501,121 B1 | 12/2002 | Yu et al. |
| 6,504,189 B1 | 1/2003 | Matsuda et al. |
| 6,524,651 B1 | 2/2003 | Gan et al. |
| 6,528,374 B1 | 3/2003 | Bojarczuk, Jr. et al. |
| 6,538,359 B1 | 3/2003 | Hiraku et al. |
| 6,589,887 B1 | 7/2003 | Dalton et al. |
| 2001/0013313 A1 | 8/2001 | Droopad et al. |
| 2001/0020278 A1 | 9/2001 | Saito |
| 2001/0036142 A1 | 11/2001 | Kadowaki et al. |
| 2001/0055820 A1 | 12/2001 | Sakurai et al. |
| 2002/0006245 A1 | 1/2002 | Kubota et al. |
| 2002/0008234 A1 | 1/2002 | Emrick |
| 2002/0021855 A1 | 2/2002 | Kim |
| 2002/0030246 A1 | 3/2002 | Eisenbeiser et al. |
| 2002/0047123 A1 | 4/2002 | Ramdani et al. |
| 2002/0047143 A1 | 4/2002 | Ramdani et al. |
| 2002/0052061 A1 | 5/2002 | Fitzgerald |
| 2002/0072245 A1 | 6/2002 | Ooms et al. |
| 2002/0076878 A1 | 6/2002 | Wasa et al. |
| 2002/0079576 A1 | 6/2002 | Seshan |
| 2002/0131675 A1 | 9/2002 | Litvin |
| 2002/0140012 A1 | 10/2002 | Droopad |
| 2002/0145168 A1 | 10/2002 | Bojarczuk, Jr. et al. |
| 2002/0179000 A1 | 12/2002 | Lee et al. |
| 2002/0195610 A1 | 12/2002 | Klosowiak |

FOREIGN PATENT DOCUMENTS

| | | |
|---|---|---|
| DE | 197 12 496 | 10/1997 |
| DE | 198 29 609 | 1/2000 |
| DE | 100 17 137 | 10/2000 |

| | | | | | | |
|---|---|---|---|---|---|---|
| EP | 0 247 722 | 12/1987 | | JP | 63-34994 | 2/1988 |
| EP | 0 250 171 | 12/1987 | | JP | 63-131104 | 6/1988 |
| EP | 0 300 499 | 1/1989 | | JP | 63-198365 | 8/1988 |
| EP | 0 309 270 | 3/1989 | | JP | 63-289812 | 11/1988 |
| EP | 0 331 338 | 9/1989 | | JP | 64-50575 | 2/1989 |
| EP | 0 331 467 | 9/1989 | | JP | 64-52329 | 2/1989 |
| EP | 0 342 937 | 11/1989 | | JP | 1-102435 | 4/1989 |
| EP | 0 392 714 | 10/1990 | | JP | 1-179411 | 7/1989 |
| EP | 0 412 002 | 2/1991 | | JP | 01-196809 | 8/1989 |
| EP | 0 455 526 | 6/1991 | | JP | 03-149882 | 11/1989 |
| EP | 0 483 993 | 5/1992 | | JP | HEI 2-391 | 1/1990 |
| EP | 0 494 514 | 7/1992 | | JP | 02051220 | 2/1990 |
| EP | 0 514 018 | 11/1992 | | JP | 3-41783 | 2/1991 |
| EP | 0 538 611 | 4/1993 | | JP | 03046384 | 2/1991 |
| EP | 0 581 239 | 2/1994 | | JP | 3-171617 | 7/1991 |
| EP | 0 600 658 | 6/1994 | | JP | 03-188619 | 8/1991 |
| EP | 0 602 568 | 6/1994 | | JP | 5-48072 | 2/1993 |
| EP | 0 607 435 | 7/1994 | | JP | 5-086477 | 4/1993 |
| EP | 0 614 256 | 9/1994 | | JP | 5-152529 | 6/1993 |
| EP | 0 619 283 | 10/1994 | | JP | 05150143 | 6/1993 |
| EP | 0 630 057 | 12/1994 | | JP | 05 221800 | 8/1993 |
| EP | 0 661 561 | 7/1995 | | JP | 5-232307 | 9/1993 |
| EP | 0 860 913 | 8/1995 | | JP | 5-238894 | 9/1993 |
| EP | 0 682 266 | 11/1995 | | JP | 5-243525 | 9/1993 |
| EP | 0 711 853 | 5/1996 | | JP | 5-291299 | 11/1993 |
| EP | 0 766 292 | 4/1997 | | JP | 06-069490 | 3/1994 |
| EP | 0 777 379 | 6/1997 | | JP | 6-232126 | 8/1994 |
| EP | 0 810 666 | 12/1997 | | JP | 6-291299 | 10/1994 |
| EP | 0 828 287 | 3/1998 | | JP | 6-334168 | 12/1994 |
| EP | 0 852 416 | 7/1998 | | JP | 0812494 | 1/1996 |
| EP | 0 875 922 | 11/1998 | | JP | 9-67193 | 3/1997 |
| EP | 0 881 669 | 12/1998 | | JP | 9-82913 | 3/1997 |
| EP | 0 884 767 | 12/1998 | | JP | 10-256154 | 9/1998 |
| EP | 0 926 739 | 6/1999 | | JP | 10-269842 | 10/1998 |
| EP | 0 957 522 | 11/1999 | | JP | 10-303396 | 11/1998 |
| EP | 0 964 259 | 12/1999 | | JP | 10-321943 | 12/1998 |
| EP | 0 964 453 | 12/1999 | | JP | 11135614 | 5/1999 |
| EP | 0 993 027 | 4/2000 | | JP | 11-238683 | 8/1999 |
| EP | 0 999 600 | 5/2000 | | JP | 11-260835 | 9/1999 |
| EP | 1 001 468 | 5/2000 | | JP | 01 294594 | 11/1999 |
| EP | 1 035 759 | 9/2000 | | JP | 11340542 | 12/1999 |
| EP | 1 037 272 | 9/2000 | | JP | 2000-068466 | 3/2000 |
| EP | 1 043 426 | 10/2000 | | JP | 2 000 1645 | 6/2000 |
| EP | 1 043 427 | 10/2000 | | JP | 2000-278085 | 10/2000 |
| EP | 1 043 765 | 10/2000 | | JP | 2000-349278 | 12/2000 |
| EP | 1 054 442 | 11/2000 | | JP | 2000-351692 | 12/2000 |
| EP | 1 069 605 | 1/2001 | | JP | 2001-196892 | 7/2001 |
| EP | 1 069 606 | 1/2001 | | JP | 2002-9366 | 1/2002 |
| EP | 1 085 319 | 3/2001 | | WO | WO 92/10875 | 6/1992 |
| EP | 1 089 338 | 4/2001 | | WO | WO 93/07647 | 4/1993 |
| EP | 1 109 212 | 6/2001 | | WO | WO 94/03908 | 2/1994 |
| EP | 1 176 230 | 1/2002 | | WO | WO 95/02904 | 1/1995 |
| FR | 2 779 843 | 12/1999 | | WO | WO 97/45827 | 12/1997 |
| GB | 1 319 311 | 6/1970 | | WO | WO 98/05807 | 1/1998 |
| GB | 2 152 315 | 7/1985 | | WO | WO 98/20606 | 5/1998 |
| GB | 2 335 792 | 9/1999 | | WO | WO 99/14797 | 3/1999 |
| JP | 52-88354 | 7/1977 | | WO | WO 99/14804 | 3/1999 |
| JP | 52-89070 | * 7/1977 | | WO | WO 99/19546 | 4/1999 |
| JP | 52-135684 | 11/1977 | | WO | WO 99/63580 | 12/1999 |
| JP | 54-134554 | 10/1979 | | WO | WO 99/67882 | 12/1999 |
| JP | 55-87424 | 7/1980 | | WO | WO 00/06812 | 2/2000 |
| JP | 58-075868 | 5/1983 | | WO | WO 00/16378 | 3/2000 |
| JP | 58-213412 | 12/1983 | | WO | WO 00/33363 | 6/2000 |
| JP | 59-044004 | 3/1984 | | WO | WO 00/48239 | 8/2000 |
| JP | 59-073498 | 4/1984 | | WO | WO 01/04943 A1 | 1/2001 |
| JP | 59066183 | 4/1984 | | WO | WO 01/16395 | 3/2001 |
| JP | 60-161635 | 8/1985 | | WO | WO 01/33585 | 5/2001 |
| JP | 60-210018 | 10/1985 | | WO | WO 01/37330 | 5/2001 |
| JP | 60-212018 | 10/1985 | | WO | WO 01/59814 A2 | 8/2001 |
| JP | 61-36981 | 2/1986 | | WO | WO 01/59820 A1 | 8/2001 |
| JP | 61-63015 | 4/1986 | | WO | WO 01/59821 A1 | 8/2001 |
| JP | 61-108187 | 5/1986 | | WO | WO 01/59837 | 8/2001 |
| JP | 62-245205 | 10/1987 | | WO | WO 02 01648 | 1/2002 |

| | | |
|---|---|---|
| WO | WO 02/03113 | 1/2002 |
| WO | WO 02/03467 | 1/2002 |
| WO | WO 02/03480 | 1/2002 |
| WO | WO 02/08806 | 1/2002 |
| WO | WO 02/009150 | 1/2002 |
| WO | WO 02/09160 A2 | 1/2002 |
| WO | WO 02/11254 | 2/2002 |
| WO | WO 02/33385 A2 | 4/2002 |
| WO | WO 02/47127 A2 | 6/2002 |
| WO | WO 02/50879 | 6/2002 |
| WO | WO 02/099885 | 12/2002 |
| WO | WO 03/012874 | 2/2003 |

OTHER PUBLICATIONS

Nakagawara et al., Effects of Buffer Layers in Epitaxial Growth of $SrTiO_3$ Thin Film on Si(100), *J. Appl. Phys.*, 78 (12), Dec. 15, 1995, pp. 7226-7230.

Suzuki et al., "A Proposal of Epitaxial Oxide Thin Film Structures For Future Oxide Electronics," *Materials Science and Engineering B41*, (1996), pp. 166-173.

W. F. Egelhoff et al., "Optimizing GMR Spin Valves: The Outlook for Improved Properties", *1998 Int'l Non Volatile Memory Technology Conference*, pp. 34-37.

Wang et al., "Processing and Performance of Piezoelectric Films", Univ. Of MD, Wilcoxon Research Col, and Motorola Labs, May 11, 2000.

M. Rotter et al., "Nonlinear Acoustoelectric Interactions in $GaAs/LiNbO_3$ Structures", *Applied Physics Letters*, vol. 75(7), Aug. 16, 1999, pp. 965-967.

K. Sreenivas et al., "Surface Acoustic Wave Propagation on Lead Zirconate Titanate Thin Films," *Appl. Phys. Lett.* 52 (9), Feb. 29, 1998, pp. 709-711.

M. Rotter et al., "Single Chip Fused Hybrids for Acousto-Electric and Acousto-Optic Applications," *1997 Applied Physics Letters*, vol. 70(16), Apr. 21, 1997, pp. 2097-2099.

A. Mansingh et al., "Surface Acoustic Wave Propagation in $PZT/YBCO/SrTiO_3$ and $PbTiO_3/YBCO/SrTiO_3$ Epitaxial Heterostructures," *Ferroelectric*, vol. 224, pp. 275-282, 1999.

S. Mathews et al., "Ferroelectric Field Effect Transistor Based on Epitaxial Perovskite Heterostructures", *Science*, vol. 276, Apr. 11, 1997, pp. 238-240.

R. Houdre et al., "Properties of GaAs on Si Grown by Molecular Beam Epitaxy," *Solid State and Materials Sciences*, vol. 16, issue 2, 1990, pp. 91-114.

S. F. Fang et al., "Gallium Arsenide and Other Compound Semiconductors on Silicon," *J. Appl. Phys.*, 68(7), Oct. 1, 1990, pp. R31-R58.

Carlin et al., Impact of GaAs Buffer Thickness on Electronic Quality of GaAs Grown on Graded Ge/GeSi/Si Substrates, *Appl. Phys. Letter*, vol. 76, No. 14, Apr. 2000, pp. 1884-1886.

Ringel et al., "Epitaxial Integration of III-V Materials and Devices with Si Using Graded GeSi Buffers," 27th International Symposium on Compound Semiconductors, Oct. 2000.

Zogg et al., "Progress in Compound-Semiconductor-on-Silicon-Heteroepitaxy with Fluoride Buffer Layers," *J. Electrochem Soc.*, vol. 136, No. 3, Mar. 1998, pp. 775-779.

Xiong et al., "Oxide Defined GaAs Vertical-Cavity Surface-Emitting Lasers on Si Substrates," *IEEE Photonics Technology Letters*, vol. 12, No. 2, Feb. 2000, pp. 110-112.

Clem et al., "Investigation of PZT//LSCO//Pt//Aerogel Thin Film Composites for Uncooled Pyroelectric IR Detectors," *Mat. Res. Soc. Symp. Proc.*, vol. 541, pp. 661-666, 1999.

Gunapala et al., "Bound-To-Quasi-Bound Quantum-Well Infrared Photodetectors," NASA Tech Brief, vol. 22, No. 9, Sep. 1998.

Abhay M. Joshi et al., "Monolithic InGaAs-on-silicon Wave Infrared Detector Arrays," *Intn. Society for Optical Engineering*, vol. 2999, pp. 211-224.

Bruley et al., "Nanostructure and Chemistry of a (100)MgO/(100) GaAs Interface," *Appl. Phys lett*, 65(5), Aug. 1994, pp. 564-566.

Fork et al., "Epitaxial MgO On Si(001) for Y-Ba-Cu-O Thin Film Growth by Pulsed Laser Deposition," *Appl. Phys Lett.*, 58(20), May 20, 1991, pp. 2294-2296.

Himpsel et al., "Dialectrics on Semiconductors," *Materials Science and Engineering*, B1(1988), pp. 9-13.

Li et al., "Epitaxial $La_{0.67}Sr_{0.33}MnO_3$ Magnetic Tunnel Junctions," *J. Appl. Phys.* 81(8), Apr. 15, 1997, pp. 5509-5511.

O'Donneil et al., "Colossal Magnetoresistance Magnetic Tunnel Junctions Grown by Molecular-Beam Epitaxy," *Appl. Physics Letters*, vol. 76, No. 14, Apr. 3, 2000, pp. 1914-1916.

Mikami et al., "Formation of Si $Epi/MgO-Al_2O_3Epi./SiO_3/$Si and Its Epitaxial Film Quality," Fundamental Research Laboratories and Microelectronics Laboratories, pp. 31-34, 1983.

T. Asano et al., "An Epitaxial Si/Insulator/Si Structure Prepared by Vacuum Deposition of $CaF_2$ and Silicon," *Thin Solid Films*, vol. 93 (1982), pp. 143-150.

T. Chikyow et al., "Reaction and Regrowth Control of $CeO_2$ on Si(111) Surface for the Silicon-On-Insulator Structure," *Appl. Phys. Lett.*, vol. 65, No. 8, Aug. 22, 1994, pp. 1030-1032.

J.F. Kang, et al., "Epitaxial Growth of $CeO_2(100)$ Films on Si(100) Substrates by Dual Ion Beams Reactive Sputtering," *Solid State Communications*, vol. 108, No. 4, pp. 225-227, 1998.

R.A. Morgan et al., "Vertical-Cavity Surface-Emitting Lasers Come of Age," *SPIE*, vol. 2683, pp. 18-29.

"Technical Analysis of Qualcomm QCP-800 Portable Cellular Phone (Transmitter Circuitry)," Talus Corporation, Qualcomm QCP-800 Technical Analysis Report, Dec. 10, 1996, pp. 5-8.

Jo-Ey Wong, et al.; "An Electrostatically-Actuated MEMS Switch for Power Applications"; IEEE, 2000; pp. 633-638.

T. Mizuno, et al.; "Electron and Hole Mobility Enhancement in Strained-Si MOSFET's on SiGe-on-Insulator Substrates Fabricated by SIMOX Technology"; IEEE Electron Device Letters, vol. 21. No. 5, May 2000; pp. 230-232.

F.M. Buffer, et al.; "Strain-dependence of electron transport in bulk Si and deep-submicron MOSFET's" Computatural Electronics, 2000, Book of Abstracts, IWCE Glasgow 2000, 7th Int'l Workshop on, 2000; pp. 64-65.

S.S. Lu, et al.; "Piezoelectric field effect transistor (PEFET) using $In_{0.2}Ga_{0.8}As/Al_{0.35}Ga_{0.65}As/In_{0.2}Ga_{0.8}As/GaAs$ Strained layer structure on (111)B GaAs substrate"; Electronics Letters, 12TH Ma 1994, vol. 30, No. 10; pp. 823-825.

Kihong Kim, et al."On-Chip Wireless Interconnection with Integrated Antennas"; 2000 IEEE; pp. 20.2.1-20.3.4.

G. Passiopoulos, et al.; "V-Band Single Chip, Direct Carrier BPSK Modulation Transmitter with Integrated Patch Antenna"; 1998 IEEE MTT-S Digest; pp. 305-308.

Mau-Chung Frank Chang, et al.; "RF/Wireless Interconnect for Inter- and Intra-Chip Communications"; Proceedings of the IEEE, vol. 89, No. 4, Apr. 2001; pp. 456-466.

The Electronics Industry Report; Prismark; 2001; pp. 111-120.

J.K. Abrokwah, et al.; "A Manufacturable Complementary GaAs Process"; GaAs IC Symposium, IEEE, 1993; pp. 127-130.

H. Nagata, "A Preliminary Consideration of the Growth Behaviour of $CeO_2$, $SrTiO_3$ and $SrVO_3$ Films on Si Substrate," *Thin Solid Films*, 224, 1993, pp. 1-3.

Nagata et al., "Heteroepitaxial Growth of $CeO_2$(001) Films on Si(001) Substrates by Pulsed Laser Deposition in Ultrahigh Vacuum," *Jpn. Jour. Appl. Phys.*, vol. 30, No. 6B, Jun. 1991, pp. L1136-L1138.

Kado et al., "Heteroepitaxial Growth of SrO Films on Si Substrates," *J. Appl. Phys.*, 61(6), Mar. 15, 1987, pp. 2398-2400.

H. Ishiwara et al., "Epitaxial Growth of Perovskite Type Oxide Films on Substrates"; *Materials Research Symposium Proceedings*, vol. 220, pp. 595-600, Apr. 29-May 3, 1991.

J.K. Abrokwah, et al.; "A Manufacturable High-Speed Low-Power Complementary GaAs Process"; Extended Abstracts of the 1994 International Conference on Solid State Devices and Materials, Yokohama, 1994, pp. 592-594.

C.J. Palmstrom et al.; "Stable and Epitaxial Contacts to III-V Compound Semiconductors"; Contacts to Semiconductors Fundamentals and Technology; Noyles Publications, 1993; pp. 67-150.

Jayshri Sabarinathat, et al.; "Submicron three-dimensional infrared GaAs/$Al_xO_y$-based photonic crystal using single-step epitaxial growth"; Applied Physics Letters, vol. 78, No. 20, May 14, 2001; pp. 3024-3026.

Philip Ball; "The Next Generation of Optical Fibers"; Technology Review, May 2001; pp. 55-61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51-96.

G. H. Jin, et al.; "PLZT Film Waveguide Mach-Zehnder Electrooptic Modulator"; Journal of Lightwave Technology, vol. 18, No. 6, Jun. 2000; pp. 807-812.

D.E. Aspnes, et al.; "Steps on (001) silicon surfaces"; J. Vac. Sci. Technol. B, vol. 5, No. 4, Jul./Aug. 1987; pp. 939-944.

D.M. Newns, et al.; "Mott transition field effect transistor"; Applied Physics Letters, vol. 73, No. 6, Aug. 10, 1998; pp. 780-782.

Lucent Technologies, Inc. "Arrayed Waveguide Grating Multiplexer/Demultiplexer"; Jan. 2000; 4 pages.

Hisashi Shichijo, et al.; "Co-Integration of GaAs MESFET and Si CMOS Circuits"; IEEE Electron Device Letters, vol. 9, No. 9, Sep. 1988; pp. 444-446.

H. Schichijo, et al.; "GaAs MESFET and Si CMOS Cointegration and Circuit Techniques"; 1988 IEEE; GaAs IC Symposium—239-242.

H. Shichijo, et al.; "Monolithic Process for Co-Integration of GaAs and Silicon Circuits"; 1988 IEEE; pp. 778-781.

Z.H. Zhu, et al. "Growth of InGaAs multi-quantum wells at 1.3 m wavelength on GaAs compliant substrates"; Applied Physics Letters, vol. 72, No. 20, May 18, 1998; pp. 2598-2600.

Kurt Eisenbeiser, et al.; "Metamorphic InAlAs/InGaAs Enhancement Mode HEMT's on GaAs Substrates"; IEEE Electron Device Letters, vol. 20, No. 10, Oct. 1999; pp. 507-509.

Tomonori Nagashima, et al.; "Three-Terminal Tandem Solar Cells With a Back-Contact Type Bottom Cell" Higashifuji Technical Center, Toyota Motor Corporation; 4 pages.

James Schellenberg, et al.; "Low-Loss, Planar Monolithic Baluns for K/Ka-Band Applications"; 1999 IEEE MTT-S Digest; pp. 1733-1736.

Arnold Leitner et al; "Pulsed Laser Deposition of Superconducting Strontium Titanate Thin-Films"; ; Session K11-Thin Films and Borocarbides; Mixed Session, Wednesday Afternoon; Mar. 19, 1997; Room 1202 B, Conv. Center (Abstract).

R.D. Vispute; "High quality optoelectronic grade epitaxial AlN films on -$Al_2O_3$, Si and 6H-SiC by pulsed laser deposition"; Thin Solid Films 299 (1997), pp. 94-103.

T. Warren Weeks, et al.; "GaN thin films deposited via organometallic vapor phase epitaxy on (6H)-SiC(0001) using high-temperature monocrystalline AlN buffer layers" 320 Applied Physics Letters, vol. 67, No. 3, Jul. 17, 1995, pp. I401-I403.

Z. Yu, et al.; "Epitaxial oxide thin films on Si(001)*"; J. Vac. Sci. Technol. B. vol. 18, No. 4, Jul./Aug. 2000; pp. 2139-2145.

Gentex Corporate Website; Photoelectric Smoke Detectors—How They Work; 2001.

Jeffrey B. Casady, et al.; "A Hybrid 6H-SiC Temperature Sensor Operational from 25 C to 500 C"; IEEE Transactions on Components, Packaging, and Manufacturing Technology—Part A, vol. 19, No. 3, Sep. 1996; pp. 416-422.

Ronald W. Waynant, et al.; "Optoelectronic Integrated Circuits"; Electro-Optics Handbook, McGraw-Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37-42.

D.A. Francis et al.; "A single-chip linear optical amplifier"; OFC, 2001; Mar. 17-22, 2001.

G. Vogg et al.; "Epitaxial alloy films of zinti-phase Ca(Si1-xGex)2"; Journal of Crystal Growth 223 (2001); pp. 573-576.

Peter S. Guilfoyle, et al.; "Optoelectronic Architecture for High-Speed Switching and Processing Applications"; 1998 The Photonics Design and Applications Handbook; pp. H-399-H.406.

Gerald B. Stringfellow; "Organometallic Vapor-Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer-Verlag Berlin Heidelberg, 1989, 1996.

"Integration of GaAs on Si Using a Spinel Buffer Layer", IBM Technical Bulletin, vol. 30, No. 6, Nov. 1987, p. 365.

"GraInAs Superconducting FET," IBM Technical Bulletin, vol. 36, No. 8, Aug. 1993, p. 655-656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of $SrTiO_3$ Films on Silicon Substrates," *Japan J of Appl. Phys.*, vol. 33, Mar. 1994, pp. 1472-1477.

Yodo et al., GaAs Heteroepitaxial Growth on Si Substrates with Thin Si Interlayers *in situ* Annealed at High Temperatures, *8257b Journal of Vacuum Science & Technology*, May/Jun. 1995, vol. 13, No. 3, pp. 1000-1005.

Cuomo et al., "Substrate Effect on the Superconductivity of $YBa_2Cu_3O_7$ Thin Films," AIP Conference 1988, pp. 141-148.

McKee et al., "Crystalline Oxides on Silicon: The First Five Monolayers," *Physical Review Letters*, vol. 81, No. 14, Oct. 1998, pp. 3014-3017.

McKee et al., "Molecular Beam Epitaxy Growth of Epitaxial Barium Silicide, Barium Oxide, and Barium Titanate on Silicon," *1991 American Institute of Physics*, pp. 782-784, Aug. 13, 1991.

Tambo et al., Molecular Beam Epitaxy Growth of $SrTiO_3$ Films on Si(100)-2×1 with SrO Buffer Layer, *Jpn. J. Appl. Phys.*, vol. 37, 1998, pp. 4454-4459.

McKee et al., "The MBE Growth and Optical Quality of $BaTiO_3$ and $SrTiO_3$ Thin Films on MgO," *Mat. Res. Soc. Symp. Proc.*, vol. 341, Apr. 1994, pp. 309-314.

McKee et al., "$BaSi_2$ and Thin Film Alkaline Earth Silicides on Silicon," *Appl. Phys. Lett.*, 63 (20), Nov. 1993, pp. 2818-2820.

McKee et al., "Surface Structures and the Orthorhombic Transformation of Thin Film $BaSi_2$ on Silicon," *Mat. Res. Soc. Symp. Proc.*, vol. 221, pp. 131-136.

Brian A. Floyd et al.; "The projected Power Consumption of a Wireless Clock Distribution System and Comparison to Conventional Distribution Systems"; IEEE, 1999; pp. IITC99-249-IITC99-250.

Mori et al., "Epitaxial Growth of $SrTiO_3$ Films on Si(100) Substrates Using a Focused Electron Beam Evaporation Method," *Jpn. J. of Apl. Phys.*, vol. 30, No. 8A, Aug. 1991, pp. L1415-L1417.

Moon et al., "Growth of Crystalline $SrTiO_3$ Films on Si Substrates Using Thin Fluoride Buffer Layers and Their Electrical Properties," *Jpn. J. of Appl. Phys.*, vol. 33, (1994), pp. 5911-5916.

Farrow et al., "Heteroepitaxy of Dissimilar Materials," *Mat. Res. Soc. Symposium Proceedings*, vol. 221, pp. 29-34, Apr. 29-May 2, 1991.

Ishiwara et al., "Heteroepitaxy on Silicon: Fundamentals, Structure, and Devices," *Mat. Res. Soc.*, Symposium Proceedings, vol. 116, pp. 369-374, Apr. 5-8, 1988.

Douglas B. Chrisey, et al; Pulsed Laser Deposition of Thin Films; pp. 273-285.

B.A. Block, et al; "Photoluminescence properties of $Er^3$-doped $BaTiO_3$ thin films"; Appl. Phys. Lett. 65 (1), Jul. 4, 1994, pp. 25-27.

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60-63, XP010210167.

Wenhua Zhu et al.; "Molecular Beam Epitaxy of GaAs on Si-on-Insulator"; 320 Applied Physics Letters 59 Jul. 8, 1991 No. 2; pp. 210-212.

Umesh K. Mishra et al; "Oxide Based Compound Semiconductor Electronics"; Electron Devices Meeting; 1997; Technical Digest, International; Washington, D.C.; Dec. 7-10, 1997; pp. 545-548.

J.M. Daughton et al.; "Applications of Spin Dependent Transport Materials"; J. Phys. D. Appl. Phys. 32(1999) R169-R177.

Wei Zhang et al.; "Stress Effect and Enhanced Magnetoresistance in $La_{0.67}Ca_{0.33}MnO_{3-\delta}$ Films"; Physical Review, B. Condensed Matter; American Institute of Physics; vol. 58, No. 21, Part 1; Dec. 1, 1998; pp. 14143-14146.

Q.-Y. Tong et al.; "IOS-a new type of materials combination for system-on-a chip preparation"; 1999 IEEE International SOI Conference, Oct. 1999; pp. 104-105.

T. Kanniainen et al.; "Growth of Dielectric 1hfo2/Ta205 Thin Film Nanolaminate Capacitors By Atomic Layer Epitaxy"; Electrochemical Society Proceedings, U.S. Electrochemical Society; Pennington, N.J.; Aug. 31, 1997; pp. 36-46.

Myung Bok Lee; "Heteroepitaxial Growth of $BaTio_3$ Films on Si by Pulsed Laser Deposition"; Applied Physics Letters; Mar. 13, 1995; pp. 1331-1333.

Myung Bok Lee; "Formation and Characterization of Epitaxial $TiO_2$ and $BaTiO_3/TiO_2$ Films on Si Substrate"; Japan Journal Applied Physics Letters; vol. 34; 1995; pp. 808-811.

Gilbert Lecarpentier et al.; "High Accuracy Machine Automated Assembly for Opto Electronics"; 2000 Electronic Components and Technology Conference; pp. 1-4.

R. Ramesh; "Ferroelectric La-Sr-Co-O/Pb-Zr-Ti-O/La-Sr-Co-O Heterostructures on Silicon via Template Growth"; 320 Applied Physics Letters; 63(1993); Dec. 27; No. 26; pp. 3592-3594.

K. Eisenbeiser; "Field Effect Transistors with $SrTiO_3$ Gate Dielectric on Si"; Applied Physics Letters; vol. 76, No. 10; Mar. 6, 2000; pp. 1324-1326.

Stephen A. Mass; "Microwave Mixers"; Second Edition; 2pp.

Douglas J. Hamilton et al.; "Basic Integrated Circuit Engineering"; pp. 2; 1975.

Takeshi Obata; "Tunneling Magnetoresistance at Up to 270 K in $La_{0.8}Sr_{0.2}MnO_3/SrTiO_3/La_{0.8}Sr_{0.2}MnO_3$ Junctions with 1.6-nm-Thick Barriers"; Applied Physics Letters; vol. 74, No. 2; Jan. 11, 1999; pp. 290-292.

Wei Zhang et al.; "Enhanced Magnetoresistance in La-Ca-Mn-O Films on Si Substrates Using $YbaCuO/CeO_2$ Heterostructures"; Physica C; vol. 282-287, No. 2003; Aug. 1, 1997; pp. 1231-1232.

Shogo Imada et al; "Epitaxial Growth of Ferroelectric $YmnO_3$ Thin Films on Si (111) Substrates by Molecular Beam Epitaxy"; Jpn. J. Appl. Phys. vol. 37 (1998); pp. 6497-6501; Part 1, No. 12A, Dec. 1998.

Ladislav Pust et al.; "Temperature Dependence of the Magnetization Reversal in Co(fcc)-BN-Co(poly hcp) Structures"; Journal of Applied Physics; vol. 85, No. 8; Apr. 15, 1999; pp. 5765-5767.

C. Martinez; "Epitaxial Metallic Nanostructures on GaAs"; Surface Science; vol. 482-485; pp. 910-915; 2001.

Wen-Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305-316.

Zhu Dazhong et al.; "Design of $ZnO/SiO_2/Si$ Monolithic Integrated Programmable SAW Filter"; Proceedings of Fifth International Conference on Solid-State and Integrated Circuit Technology; Oct. 21-23, 1998; pp. 826-829.

Kirk-Othmer Encyclopedia of Chemical Technology; Fourth Edition, vol. 12; Fuel Resources to Heat Stabilizers; A Wiley-Interscience Publication; John Wiley & Sons.

Joseph W. Goodman et al; "Optical Interconnections For VLSI Systems"; Proceedings of the IEEE, vol. 72, No. 7 Jul. 1984.

Fathimulla et al.; "Monolithic Integration of InGaAs/InAlAs MODFETs and RTDs on InP-bonded-to Si Substrate"; Fourth International Conference on Indium Phosphide and Related Materials, Newport, RI, USA; Apr. 21-24, 1992 ; pp. 167-170; XP000341253; IEEE, New York, NY, USA; ISBN: 0-7803-0522-1.

H. Takahashi et al.; "Arraryed-Waveguide Grating For Wavelength Division Multi/Demultiplexer With Nanometre REsolution"; Electronics Letters; vol. 26., No. 2, Jan. 18, 1990.

Pierret, R.F.; "1/J-FET and MESFET"; Field Effect Devices; MA, Addison-Wesley; 1990; pp. 9-22.

M. Schreiter, et al.; "Sputtering of Self-Polarized PZT Films for IR-Detector Arrays"; 1998 IEEE; pp. 181-185.

Hideaki Adachi et al.; "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

A.J. Moulson et al.; "Electroceramics Materials Properties Applications"; Chapman & Hall; pp. 366-369.

P.A. Langjahr et al., "Epitaxial Growth and Structure of Cubic and Pseudocubic Peroskite Films on Perovskite Substrates"; Mat. Res. Soc. Symp. Proc., vol. 401; 1995 Materials Research Society; pp. 109-114.

Wang et al.; "Depletion-Mode GaAs MOSFETs with Negligible Drain Current Drift and Hysteresis"; Electron Devices Meeting, 1998, IEDM '98 Technical Digest; pp. 67-70.

Ben G. Streetman; "Solid State Electronic Devices"; 1990, Prentice Hall; Third Edition; pp. 320-322.

A.Y Wu et al.; "Highly Oriented (Pb,La)(Zr,Ti)$O_3$ Thin Films on Amorphous Substrates"; IEEE, 1992; pp. 301-304.

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321-326.

S.N. Subbarao et al.; "Monolithic PIN Photodetector and FET Amplifier on GaAs-os-Si"; IEEE; GaAs IC Symposium-163-166; 1989.

T.A. Langdo et al.; "High Quality Ge on Si by Epitaxial Necking"; Applied Physics Letters; vol. 76, No. 25; pp. 3700-3702; Jun. 19, 2000.

Chenning Hu et al.; Solar Cells From Basics to Advanced Systems; McGraw-Hill Book Company; 1983.

O.J. Painter et al; "Room Temperature Photonic Crystal Defect Lasers at Near-Infrared Wavelengths in InGaAsp"; Journal of Lightwave Technology, vol. 17, No. 11; Nov. 1999.

C. Donn et al.; "A 16-Element, K-Band Monolithic Active Receive Phased Array Antenna"; Antennas and Propagation Society International Symposium, 1988; pp. 188-191, vol. 1; Jun. 6-10, 1988.

Don W. Shaw; "Epitaxial GaAs on Si: Progress and Potential Applications"; Mat. Res. Soc. Symp. Proc.; pp. 15-30; 1987.

G.J.M. Dormans, et al.; "PbTiO/$_3$/Thin Films Grown by Organometallic Chemical Vapour Deposition"; Third International Symposium on Integrated Ferroelectrics; Apr. 3-5, 1991 (Abstract).

P.J. Borrelli et al.; "Compositional and Structural Properties of Sputtered PLZT Thin Films"; Ferroelectric Thin Films II Symposium; Dec. 2-4, 1991 (Abstract).

Ranu Nayak et al; "Enhanced acousto-optic diffraction efficiency in a symmetric SrRiO3/BaTiO3/SrTiO3 thin-film heterostructure"; Nov. 1, 2000; vol. 39, No. 31; Applied Optics; pp. 5847-5853.

Ranu Nayak et al; "Studies on acousto-optical interaction in SrTiO3/BaTiO3/SrTiO3 epitaxial thin film heterostructures"; J. Phys. D: Appl. Phys. 32 (1999) 380-387.

S.K. Tewksbury et al.; "Cointegration of Optoelectronics and Submicron CMOS"; Wafer Scale Integration; 1993; Proceedings, Fifth Annual IEEE; Jan. 20, 1993; pp. 358-367.

V. Kaushik et al.; "Device Characteristics of Crystalline Epitaxial Oxides on Silicon"; Device Research Conference, 2000; Conference Digest 58th DRC; pp. 17-20; Jun. 19-21, 2000.

Katherine Derbyshire; "Prospects Bright for Optoelectronics Volume, Cost Drive Manufacturing for Optical Applications"; Semiconductor Magazine; vol. 3, No. 3; Mar. 2002.

Alex Chediak et al; "Integration of GaAs/Si with Buffer Layers and Its Impact on Device Integration"; TICS 4, Prof. Sands. MSE 225, Apr. 12, 2002; pp. 1-5.

S.A. Chambers et al; "Band Discontinuities at Epitaxial SrTiO3/Si(001) Heterojunctions"; Applied Physics Letters; vol. 77, No. 11; Sep. 11, 2000; pp. 1662-1664.

H. Wang et al.; "GaAs/GaAlAs Power HBTs for Mobile Communications"; Microwave Symposium Digest; 1993 IEEE; vol. 2.; pp. 549-552.

Y. Ota et al.; "Application of Heterojunction FET to Power Amplifier for Cellular Telephone"; Electronics Letters; May 26 1994; vol. 30, No. 11; pp. 906-907.

Keiichi Sakuno et al; "A 3.5W HBT MMIC Power Amplifier Module for Mobile Communications"; IEEE 1994; Microwave and Millimeter-Wave Monolithic Circuits Symposium; pp. 63-66.

Mitsubishi Semiconductors Press Release (GaAs FET's) Nov. 8, 1999 pp. 1-2.

R.J. Matyi et al; "Selected Area Heteroepitaxial Growth of GaAs on Silicon for Advanced Device Structures"; 2194 Thin Solid Films; 181 (1989) Dec. 10; No. 1; pp. 213-225.

K. Nashimoto et al; "Patterning of Nb, LaOnZr, TiO3 Waveguides for Fabricating Micro-Optics Using Wet Etching and Solid-Phase Epitaxy"; Applied Physics Letters; vol. 75, No. 8; Aug. 23, 1999; pp. 1054-1056.

Bang-Hung Tsao et al; "Sputtered Barium Titanate and Barium Strontium Titanate Films for Capacitor Applications"; Applications of Ferroelectrics, 2000; Proceedings of the 2000 12th International Symposium on vol. 2; pp. 837-840.

Man Fai Ng et al; "Heteroepitaxial growth of lanthanum aluminate films derived from mixed metal nitrates"; Journal of Materials Research; vol. 12, No. 5; pp. 1306.

Yuji Matsumoto et al.; "Room-Temperature Ferromagnetism in Transparent Transition Metal-Doped Titanium Dioxide"; Science; Feb. 2, 2001; vol. 291; pp. 854-856.

S.A. Chambers et al.; "Epitaxial Growth and Properties of Ferromagnetic Co-Doped TiO2 Anatase"; Applied Physics Letters; vol. 79, No. 21; Nov. 19, 2001; pp. 3467-3469.

Charles Kittel; "Introduction to Solid State Physics"; John Wiley & Sons, Inc. Fifth Edition; pp. 415.

Chyuan-Wei Chen et al; "Liquid-phase epitaxial growth and characterization of InGaAsP layers grown on GaAsP substrates for application to orange light-emitting diodes"; 931 Journal of Applied Physics; 77 (1995) Jan. 15, No. 2; Woodbury, NY, US; pp. 905-909.

W. Zhu et al. ; "Oriented diamond films grown on nickel substrates"; 320 Applied Physics Letters; 63(1993) Sep., No. 12, Woodbury, NY, US; pp. 1640-1642.

M. Schreck et al. ; "Diamond/Ir/SrTiO3: A material combination for improved heteroepitaxial diamond films"; Applied Physics Letters; vol. 74, No. 5; Feb. 1, 1999; pp. 650-652.

Yoshihiro Yokota et al. ; "Cathodoluminescence of boron-doped heteroepitaxial diamond films on platinum"; Diamond and Related Materials 8(1999); pp. 1587-1591.

J.R. Busch et al. ; "Linear Electro-Optic Response in Sol-Gel PZT Planar Waveguide" ; Electronics Letters; Aug. 13, 1992; vol. 28, No. 17; pp. 1591-1592.

R. Droopad et al; "Epitaxial Oxide Films on Silicon: Growth, Modeling and Device Properties" ; Mat. Res. Soc. Symp. Proc. vol. 619; 2000 Materials Research Society; pp. 155-165.

H. Ohkubo et al. ; "Fabrication of High Quality Perovskite Oxide Films by Lateral Epitaxy Verified with RHEED Oscillation" ; 2419A Int. Conf. on Solid State Devices & Materials, Tsukuba, Aug. 26-28 (1992); pp. 457-459.

Lin Li; "Ferroelectric/Superconductor Heterostructures" ; Materials Science and Engineering: 29 (2000) pp. 153-181.

L. Fan et al. ; "Dynaamic Beam Switching of Vertical-Cavity Surface-Emitting Lasers with Integrated Optical Beam Routers" ; IEEE Photonics Technology Letters; vol. 9, No. 4; Apr. 4, 1997; pp. 505-507.

Y. Q. Xu. et al. ; "(Mn, Sb) dropped-Pb(Zr, Ti)03 infrared detector arrays" ; Journal of Applied Physics; vol. 88, No. 2; Jul. 15, 2000; pp. 1004-1007.

Kiyoko Kato et al. ; "Reduction of dislocations in InGaAs layer on GaAs using epitaxial lateral overgrowth" ; 2300 Journal of Crystal Growth 115 (1991) pp. 174-179; Dec. 1991.

Peter Weiss; "Speed demon gets hooked on silicon"; Science News Online; Sep. 15, 2001; pp. 1-3.

"Motorola Develops New Super-Fast Chip"; USA Today; Sep. 4, 2001.

Lori Valigra; "Motorola Lays GaAs on Si Wafer"; AsiaBizTech; Nov. 2001pp. 1-3.

"Holy Grail! Motorola Claims High-Yield GaAs Breakthrough"; Micromagazine.com (no date available); pp. 1-3.

Jong-Gul Yoon; "Growth of Ferroelectric LiNbO3 Thin Film on MgO-Buffered Si by the Sol-Gel Method"; Journal of the Korean Physical Society (Proc. Suppl.); vol. 29, Nov. 1996; pp. S648-S651.

V. Bornand et al.; "Deposition of LiTaO3 thin films by pyrosol process"; Thin Solid Films 304 (1997); pp. 239-244.

R. Droopad et al.; "Development of high dielectric constant epitaxial oxides on silicon by molecular beam epitaxy"; Materials Science and Engineering B87 (2001); pp. 292-296.

A.K. Sharma et al.; "Integration of Pb(Zr0.52Ti0.48)O3 epilayers with Si by domain epitaxy"; Applied Physics Letters, vol. 76, No. 11; Mar. 13, 2000; pp. 1458-1460.

Dwight C. Streit et al; "High Reliability GaAs-AlGaAs HBT's by MBE with Be Base Doping and InGaAs Emitter Contacts"; 8179 Ieee Electron Device Letters; Sep. 12, 1991, No. 9, New York, US.

C. Y. Hung et al; "Piezoelectrically induced stress tuning of electro-optic devices"; 320 Applied Physics Letters; 59(1991) Dec. 30, No. 27, New York, US.

J. Piprek; "Heat Flow Analysis of Long-Wvelength VCSELs with Various DBR Materials"; University of Delaware, Materials Science, Newark, DE, 19716-3106; Oct. 31, 1994; pp. 286-287.

P. Mackowiak et al.; "Some aspects of designing an efficient nitride VCSEL resonator"; J. Phys. D: Appl. Phys. 34(2001); pp. 954-958.

M.R. Wilson et al.; GaAs-On-Si: A GaAs IC Manufacturer's Perspective; GaAs IC Symposium, IEEE, 1988; pp. 243-246.

Y. Kitano et al.; "Thin film crystal growth of BaZrO3 at low oxygen partial pressure"; Journal of Crystal Growth 243 (2002); pp. 164-169.

M.E. Hawley; et al; "Microstructural Study of Colossal Magneto-Resistive Films As a Function of Growth Temperature, As Deposited and Annealed"; 401, 1996; pp. 531-536.

Yi. W. et al; "Mechanism of cleaning Si (100) surface using Sr and SrO for the growth of crystalline SrTiO/sub 2/films" Journal of Vacuum Science & Technology, vol. 20, No. 4, Jul. 2002 pp. 1402-1405.

Xiaming Hu et al; "Sr/Si template formation for the epitaxial growth of SrTiO/sub 3/on silicon" Materials Research Society Proceedings, vol. 716, 2002, pp. 261-266.

* cited by examiner

SEMICONDUCTOR STRUCTURE, SEMICONDUCTOR DEVICE, COMMUNICATING DEVICE, INTEGRATED CIRCUIT, AND PROCESS FOR FABRICATING THE SAME

CROSS REFERENCE TO RELATED APPLICATION

This application is a Divisional of application Ser. No. 10/076,450, filed Feb. 19, 2002 now abandoned, which is a Divisional of application Ser. No. 09/502,023, filed Feb. 10, 2000 now U.S. Pat. No. 6,392,257.

FIELD OF THE INVENTION

This invention relates generally to semiconductor structures and devices and to a method for their fabrication, and more specifically to compound semiconductor structures and devices and to the fabrication and use of semiconductor structures, devices, and integrated circuits that include a monocrystalline compound semiconductor material.

BACKGROUND OF THE INVENTION

The vast majority of semiconductor discrete devices and integrated circuits are fabricated from silicon, at least in part because of the availability of inexpensive, high quality monocrystalline silicon substrates. Other semiconductor materials, such as the so called compound semiconductor materials, have physical attributes, including wider bandgap and/or higher mobility than silicon, or direct bandgaps that makes these materials advantageous for certain types of semiconductor devices. Unfortunately, compound semiconductor materials are generally much more expensive than silicon and are not available in large wafers as is silicon. Gallium arsenide (GaAs), the most readily available compound semiconductor material, is available in wafers only up to about 150 millimeters (mm) in diameter. In contrast, silicon wafers are available up to about 300 mm and are widely available at 200 mm. The 150 mm GaAs wafers are many times more expensive than are their silicon counterparts. Wafers of other compound semiconductor materials are even less available and are more expensive than GaAs.

Because of the desirable characteristics of compound semiconductor materials, and because of their present generally high cost and low availability in bulk form, for many years attempts have been made to grow thin films of the compound semiconductor materials on a foreign substrate. To achieve optimal characteristics of the compound semiconductor material, however, a monocrystalline film of high crystalline quality is desired. Attempts have been made, for example, to grow layers of a monocrystalline compound semiconductor material on germanium, silicon, and various insulators. These attempts have generally been unsuccessful because lattice mismatches between the host crystal and the grown crystal have caused the resulting thin film of compound semiconductor material to be of low crystalline quality.

If a large area thin film of high quality monocrystalline compound semiconductor material was available at low cost, a variety of semiconductor devices could advantageously be fabricated in that film at a low cost compared to the cost of fabricating such devices on a bulk wafer of compound semiconductor material or in an epitaxial film of such material on a bulk wafer of compound semiconductor material. In addition, if a thin film of high quality monocrystalline compound semiconductor material could be realized on a bulk wafer such as a silicon wafer, an integrated device structure could be achieved that took advantage of the best properties of both the silicon and the compound semiconductor material.

Accordingly, a need exists for a semiconductor structure that provides a high quality monocrystalline compound semiconductor film over another monocrystalline material and for a process for making such a structure.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
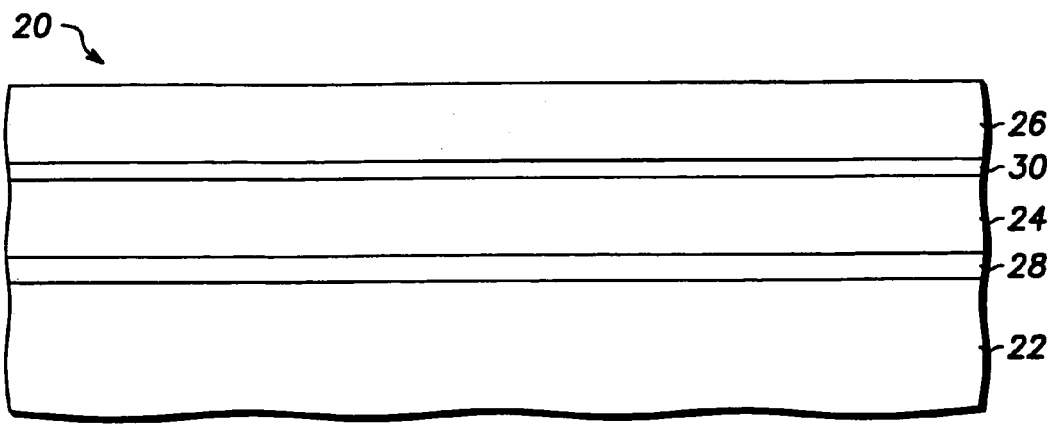
FIGS. 1, 2, 4, 5 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a layer 26 of a monocrystalline compound semiconductor material. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and compound semiconductor layer 26. As will be explained more fully below, the template layer helps to initiate the growth of the compound semiconductor layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor wafer, preferably of large diameter. The wafer can be of a material from Group IV of the periodic table, and preferably a material from Group IVA. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constants refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline compound semiconductor layer 26.

Accommodating buffer layer 24 is preferably a monocrystalline oxide or nitride material selected for its crystalline compatibility with the underlying substrate and with the overlying compound semiconductor material. For example, the material could be an oxide or nitride having a lattice structure matched to the substrate and to the subsequently applied semiconductor material. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitride may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The compound semiconductor material of layer 26 can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like. Suitable template materials chemically bond to the surface of the accommodating buffer layer 24 at selected sites and provide sites for the nucleation of the epitaxial growth of the subsequent compound semiconductor layer 26. Appropriate materials for template 30 are discussed below.

Figure 2:
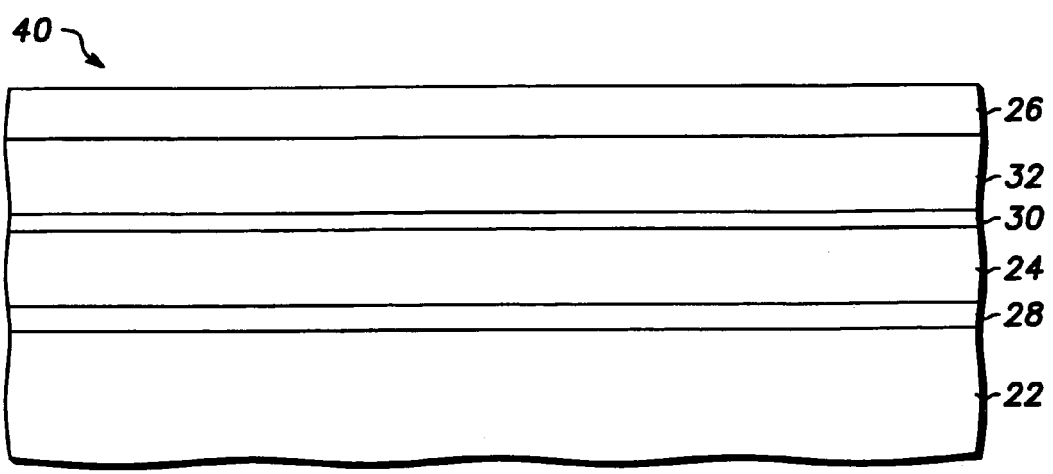

FIG. 2 illustrates, in cross section, a portion of a semiconductor structure 40 in accordance with a further embodiment of the invention. Structure 40 is similar to the previously described semiconductor structure 20 except that an additional buffer layer 32 is positioned between accommodating buffer layer 24 and layer of monocrystalline compound semiconductor material 26. Specifically, the additional buffer layer is positioned between the template layer 30 and the overlying layer of compound semiconductor material. The additional buffer layer, formed of a semiconductor or compound semiconductor material, serves to provide a lattice compensation when the lattice constant of the accommodating buffer layer cannot be adequately matched to the overlying monocrystalline compound semiconductor material layer.

The following non-limiting, illustrative examples illustrate various combinations of materials useful in structure 20 and structure 40 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 26. The accommodating buffer layer can have a thickness of about 2 to about 100 nanometers (nm) and preferably has a thickness of about 10 nm. In general, it is desired to have an accommodating buffer layer thick enough to isolate the compound semiconductor layer from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1.5–2.5 nm.

In accordance with this embodiment of the invention, compound semiconductor material layer 26 is a layer of gallium arsenide (GaAs) or aluminum gallium arsenide (AlGaAs) having a thickness of about 1 nm to about 100 micrometers (μm) and preferably a thickness of about 0.5 μm to 10 μm. The thickness generally depends on the application for which the layer is being prepared. To facilitate the epitaxial growth of the gallium arsenide or aluminum gallium arsenide on the monocrystalline oxide, a template layer is formed by capping the oxide layer. The template layer is preferably 1–10 monolayers of Ti—As, Sr—O—As, Sr—Ga—O, or Sr—Al—O. By way of a preferred example, 1–2 monolayers of Ti—As or Sr—Ga—O have been shown to successfully grow GaAs layers.

EXAMPLE 2

In accordance with a further embodiment of the invention, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a 45 degree rotation with respect to the substrate silicon lattice structure.

An accommodating buffer layer formed of these zirconate or hafnate materials is suitable for the growth of compound semiconductor materials in the indium phosphide (InP) system. The compound semiconductor material can be, for example, indium phosphide (InP) or indium gallium arsenide (InGaAs) having a thickness of about 1.0 nm to 10 μm. A suitable template for this structure is 1–10 monolayers of zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontium-oxygen (In—Sr—O), or barium-oxygen-phosphorus (Ba—O—P), and preferably 1–2 monolayers of one of these materials. By way of an example, for a barium zirconate accommodating buffer layer, the surface is terminated with 1–2 monolayers of zirconium followed by deposition of 1–2 monolayers of arsenic to form a Zr—As template. A monocrystalline layer of the compound semiconductor material from the indium phosphide system is then grown on the template layer. The resulting lattice structure of the compound semiconductor material exhibits a 45 degree rotation with respect to the accommodating buffer layer lattice structure and a lattice mismatch to (100) InP of less than 2.5%, and preferably less than about 1.0%.

EXAMPLE 3

In accordance with a further embodiment of the invention, a structure is provided that is suitable for the growth of an epitaxial film of a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 5–15 nm. The II-VI compound semiconductor material can be, for example, zinc selenide (ZnSe) or zinc sulfur selenide (ZnSSe). A suitable template for this material system includes 1–10 monolayers of zinc-oxygen (Zn—O) followed by 1–2 monolayers of an excess of zinc followed by the selenidation of zinc on the surface. Alternatively, a template can be, for example, strontium-sulfur (Sr—S) followed by the ZnSeS.

EXAMPLE 4

This embodiment of the invention is an example of structure 40 illustrated in FIG. 2. Substrate 22, monocrystalline oxide layer 24, and monocrystalline compound semiconductor material layer 26 can be similar to those described in example 1. In addition, an additional buffer layer 32 serves to alleviate any strains that might result from a mismatch of the crystal lattice of the accommodating buffer layer and the lattice of the monocrystalline semiconductor material. Buffer layer 32 can be a gallium arsenide phosphide ($GaAs_xP_{1-x}$) or indium gallium phosphide ($In_yGa_{1-y}P$) strain compensated superlattice. In the gallium arsenide phosphide superlattice the value of x ranges from 0 to 1, and in the indium gallium phosphide superlattice the value of y ranges from 0 to 1. By so varying the value of x or y, as the case may be, the lattice constant is varied from bottom to top across the superlattice to create a match between lattice constants of the underlying oxide and the overlying compound semiconductor material. The superlattice can have a thickness of about 50–500 nm and preferably has a thickness of about 200–100 nm. The template for this structure can be the same of that described in example 1. Alternatively, the buffer layer can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about one monolayer can be used. The formation of the oxide layer is capped with either a monolayer of strontium or a monolayer of titanium to act as a nucleating site for the subsequent deposition of the monocrystalline germanium. The monolayer of strontium or titanium provides a nucleating site to which the first monolayer of germanium can bond.

EXAMPLE 5

This example also illustrates materials useful in a structure 40 as illustrated in FIG. 2. Substrate material 22, accommodating buffer layer 24, monocrystalline compound semiconductor material layer 26 and template layer 30 can be the same as those described above in example 2. In addition, a buffer layer 32 is inserted between the accommodating buffer layer and the overlying monocrystalline compound semiconductor material layer. The buffer layer, a further monocrystalline semiconductor material, can be, for example, a graded layer of indium gallium arsenide (InGaAs) in which the indium composition varies from 0 to about 47%. The buffer layer preferably has a thickness of about 10–30 nm. Varying the composition of the buffer layer from GaAs to InGaAs serves to provide a lattice match between the underlying monocrystalline oxide material and the overlying layer of monocrystalline compound semiconductor material. Such a buffer layer is especially advantageous if there is a lattice mismatch between accommodating buffer layer 24 and monocrystalline compound semiconductor material layer 26.

Referring again to FIGS. 1 and 2, substrate 22 is a monocrystalline substrate such as a monocrystalline silicon substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 3:
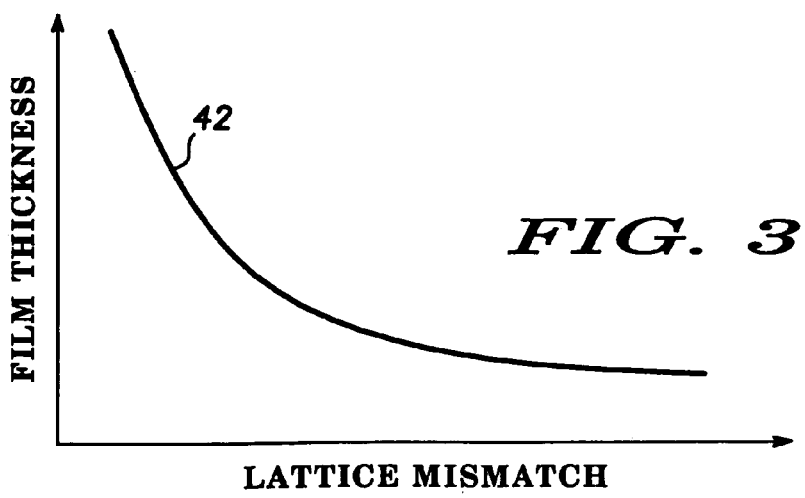
FIG. 3 illustrates graphically the relationship between maximum attainable film thickness and lattice mismatch between a host crystal and a grown crystalline overlayer.

FIG. 3 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that tend to be polycrystalline. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 24, a silicon oxide layer in this example, serves to reduce strain in the titanate monocrystalline layer that might result from any mismatch in the lattice constants of the host silicon wafer and the grown titanate layer. As a result, in accordance with an embodiment of the invention, a high quality, thick monocrystalline titanate layer is achievable.

Still referring to FIGS. 1 and 2, layer 26 is a layer of epitaxially grown monocrystalline compound semiconductor material and that crystalline material is also characterized by a crystal lattice constant and a crystal orientation. To achieve high crystalline quality in this epitaxially grown layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. If the grown crystal is gallium arsenide, aluminum gallium arsenide, zinc selenide, or zinc sulfur selenide and the accommodating buffer layer is monocrystalline $Sr_xBa_{1-x}TiO_3$, substantial matching of crystal lattice constants of the two materials is achieved, wherein the crystal orientation of the grown layer is rotated by 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved by rotating the orientation of the grown crystal layer by 45° with respect to the host oxide crystal. In some instances, a crystalline semiconductor buffer layer between the host oxide and the grown compound semiconductor layer can be used to reduce strain in the grown monocrystalline compound semiconductor layer that might result from small differences in lattice constants. Better crystalline quality in the grown monocrystalline compound semiconductor layer can thereby be achieved.

The following example illustrates a process, in accordance with one embodiment of the invention, for fabricating a semiconductor structure such as the structures depicted in FIGS. 1 and 2. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about 0.5° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE). The native oxide can be removed by first thermally depositing a thin layer of strontium in an MBE apparatus. The substrate is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing strontium oxide onto the substrate surface by MBE at a low temperature and by subsequently heating the structure to a temperature of about 750° C. At this temperature a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 400–600° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stochiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered monocrystal with the crystalline orientation rotated by 45° with respect to the ordered 2×1 crystalline structure of the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired compound semiconductor material. For the subsequent growth of a layer of gallium arsenide, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of this capping layer, arsenic is deposited to form a Ti—As bond, a Ti—O—As bond or a Sr—O—As. Any of these form an appropriate template for deposition and formation of a gallium arsenide monocrystalline layer. Following the formation of the template, gallium is introduced to the reaction with the arsenic and gallium arsenide forms. Alternatively, gallium can be deposited on the capping layer to form a Sr—O—Ga bond, and arsenic is introduced with the gallium to form the GaAs.

The structure illustrated in FIG. 2 can be formed by the process discussed above with the addition of an additional buffer layer deposition step. The buffer layer is formed overlying the template layer before the deposition of the monocrystalline compound semiconductor layer. If the buffer layer is a compound semiconductor superlattice, such a superlattice can be deposited, by MBE for example, on the template described above. If instead the buffer layer is a layer of germanium, the process above is modified to cap the strontium titanate monocrystalline layer with a final layer of either strontium or titanium and then by depositing germanium to react with the strontium or titanium. The germanium buffer layer can then be deposited directly on this template.

The process described above illustrates a process for forming a semiconductor structure including a silicon substrate, a monocrystalline strontium titanate accommodating buffer layer, and a monocrystalline gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), or the like. Further, by a similar process, other monocrystalline accommodating buffer layers such as alkaline earth metal titanates, zirconates, hafnates, tantalates, vanadates, ruthenates, and niobates, alkaline earth metal tin-based perovskites, lanthanum aluminate, lanthanum scandium oxide, and gadolinium oxide can also be grown. Further, by a similar process such as MBE, other III-V and II-VI monocrystalline compound semiconductor layers can be deposited overlying the monocrystalline oxide accommodating buffer layer.

Each of the variations of compound semiconductor materials and monocrystalline oxide accommodating buffer layer uses an appropriate template for initiating the grown of the compound semiconductor layer. For example, if the accommodating buffer layer is alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen and barium titanate can be capped with a layer of barium or barium and oxygen. Each of these depositions can be followed by the deposition of arsenic or phosphorus to react with the capping material to form a template for the deposition of a compound semiconductor material layer comprising indium gallium arsenide, indium aluminum arsenide, or indium phosphide.

Figure 4:
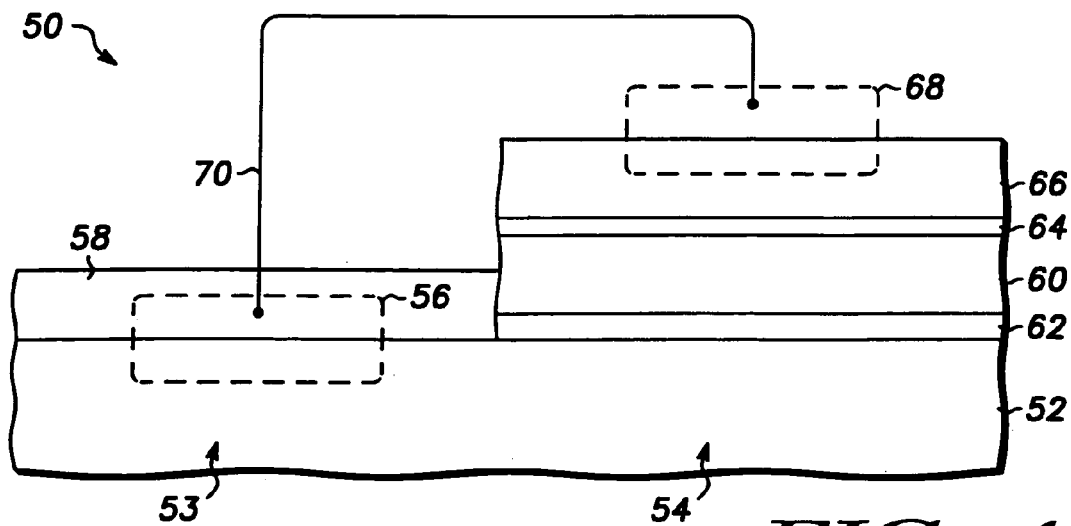

FIG. 4 illustrates schematically, in cross section, a device structure 50 in accordance with a further embodiment of the invention. Device structure 50 includes a monocrystalline semiconductor substrate 52, preferably a monocrystalline silicon wafer. Monocrystalline semiconductor substrate 52 includes two regions, 53 and 54. An electrical semiconductor component generally indicated by the dashed line 56 is formed in region 53. Electrical component 56 can be a resistor, a capacitor, an active semiconductor component such as a diode or a transistor or an integrated circuit such as a CMOS integrated circuit. For example, electrical semiconductor component 56 can be a CMOS integrated circuit configured to perform digital signal processing or another function for which silicon integrated circuits are well suited. The electrical semiconductor component in region 53 can be formed by conventional semiconductor processing as well known and widely practiced in the semiconductor industry. A layer of insulating material 58 such as a layer of silicon dioxide or the like may overlie electrical semiconductor component 56.

Insulating material 58 and any other layers that may have been formed or deposited during the processing of semiconductor component 56 in region 53 are removed from the surface of region 54 to provide a bare silicon surface in that region. As is well known, bare silicon surfaces are highly reactive and a native silicon oxide layer can quickly form on the bare surface. A layer of barium or barium and oxygen is deposited onto the native oxide layer on the surface of region 54 and is reacted with the oxidized surface to form a first template layer (not shown). In accordance with one embodiment of the invention a monocrystalline oxide layer 60 is formed overlying the template layer by a process of molecular beam epitaxy. Reactants including barium, titanium and oxygen are deposited onto the template layer to form the monocrystalline oxide layer. Initially during the deposition the partial pressure of oxygen is kept near the minimum necessary to fully react with the barium and titanium to form monocrystalline barium titanate layer 60. The partial pressure of oxygen is then increased to provide an overpressure of oxygen and to allow oxygen to diffuse through the growing monocrystalline oxide layer. The oxygen diffusing through the barium titanate reacts with silicon at the surface of region 54 to form an amorphous layer 62 of silicon oxide on the second region and at the interface between the silicon substrate and the monocrystalline oxide.

In accordance with an embodiment of the invention, the step of depositing monocrystalline oxide layer 60 is terminated by depositing a second template layer 64, which can be 1–10 monolayers of titanium., barium, barium and oxygen, or titanium and oxygen. A layer 66 of a monocrystalline compound semiconductor material is then deposited overlying the second template layer by a process of molecular beam epitaxy. The deposition of layer 66 is initiated by depositing a layer of arsenic onto the template. This initial step is followed by depositing gallium and arsenic to form monocrystalline gallium arsenide. Alternatively, strontium can be substituted for barium in the above example.

In accordance with a further embodiment of the invention, a semiconductor component, generally indicated by a dashed line 68 is formed in compound semiconductor layer 66. Semiconductor component 68 can be formed by processing steps conventionally used in the fabrication of gallium arsenide or other III–V compound semiconductor material devices. Semiconductor component 68 can be any active or passive component, and preferably is a semiconductor laser, light emitting diode, photodetector, heterojunction bipolar transistor (HBT), high frequency MESFET, or other component that utilizes and takes advantage of the physical properties of compound semiconductor materials. A metallic conductor schematically indicated by the line 70 can be formed to electrically couple device 68 and device 56, thus implementing an integrated device that includes at least one component formed in the silicon substrate and one device formed in the monocrystalline compound semiconductor material layer. Although illustrative structure 50 has been described as a structure formed on a silicon substrate 52 and having a barium (or strontium) titanate layer 60 and a gallium arsenide layer 66, similar devices can be fabricated using other substrates, monocrystalline oxide layers and other compound semiconductor layers as described elsewhere in this disclosure.

Figure 5:
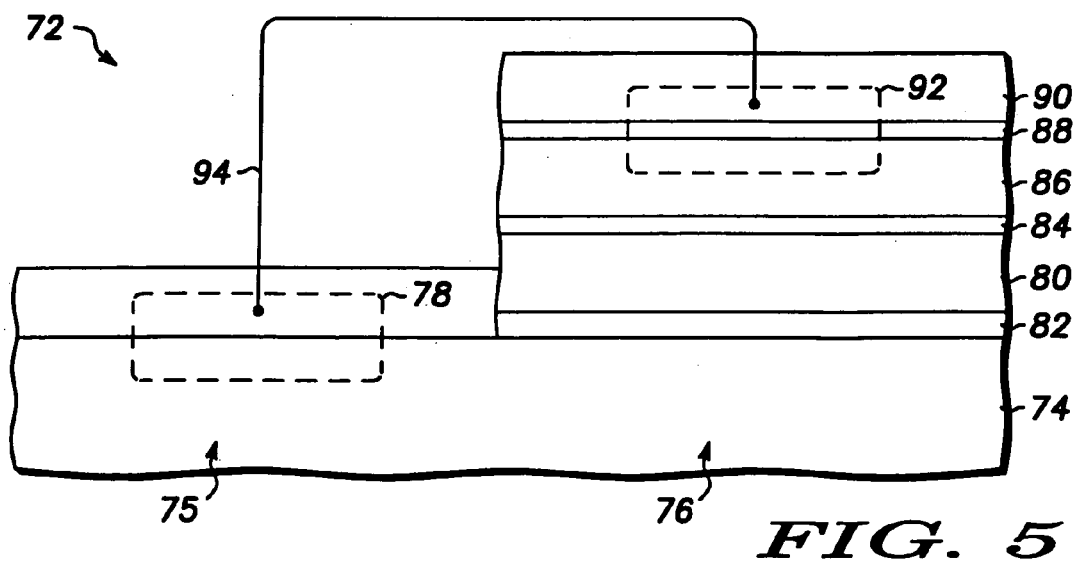

FIG. 5 illustrates a semiconductor structure 72 in accordance with a further embodiment of the invention. Structure 72 includes a monocrystalline semiconductor substrate 74 such as a monocrystalline silicon wafer that includes a region 75 and a region 76. An electrical component schematically illustrated by the dashed line 78 is formed in region 75 using conventional silicon device processing techniques commonly used in the semiconductor industry. Using process steps similar to those described above, a monocrystalline oxide layer 80 and an intermediate amorphous silicon oxide layer 82 are formed overlying region 76 of substrate 74. A template layer 84 and subsequently a monocrystalline semiconductor layer 86 are formed overlying monocrystalline oxide layer 80. In accordance with a further embodiment of the invention, an additional monocrystalline oxide layer 88 is formed overlying layer 86 by process steps similar to those used to form layer 80, and an additional monocrystalline semiconductor layer 90 is formed overlying monocrystalline oxide layer 88 by process steps similar to those used to form layer 86. In accordance with one embodiment of the invention, at least one of layers 86 and 90 are formed from a compound semiconductor material.

A semiconductor component generally indicated by a dashed line 92 is formed at least partially in monocrystalline semiconductor layer 86. In accordance with one embodiment of the invention, semiconductor component 92 may include a field effect transistor having a gate dielectric formed, in part, by monocrystalline oxide layer 88. In addition, monocrystalline semiconductor layer 92 can be used to implement the gate electrode of that field effect transistor. In accordance with one embodiment of the invention, monocrystalline semiconductor layer 86 is formed from a group III-V compound and semiconductor component 92 is a radio frequency amplifier that takes advantage of the high mobility characteristic of group III–V component materials. In accordance with yet a further embodiment of the invention, an electrical interconnection schematically illustrated by the line 94 electrically interconnects component 78 and component 92. Structure 72 thus integrates components that take advantage of the unique properties of the two monocrystalline semiconductor materials.

Figure 6:
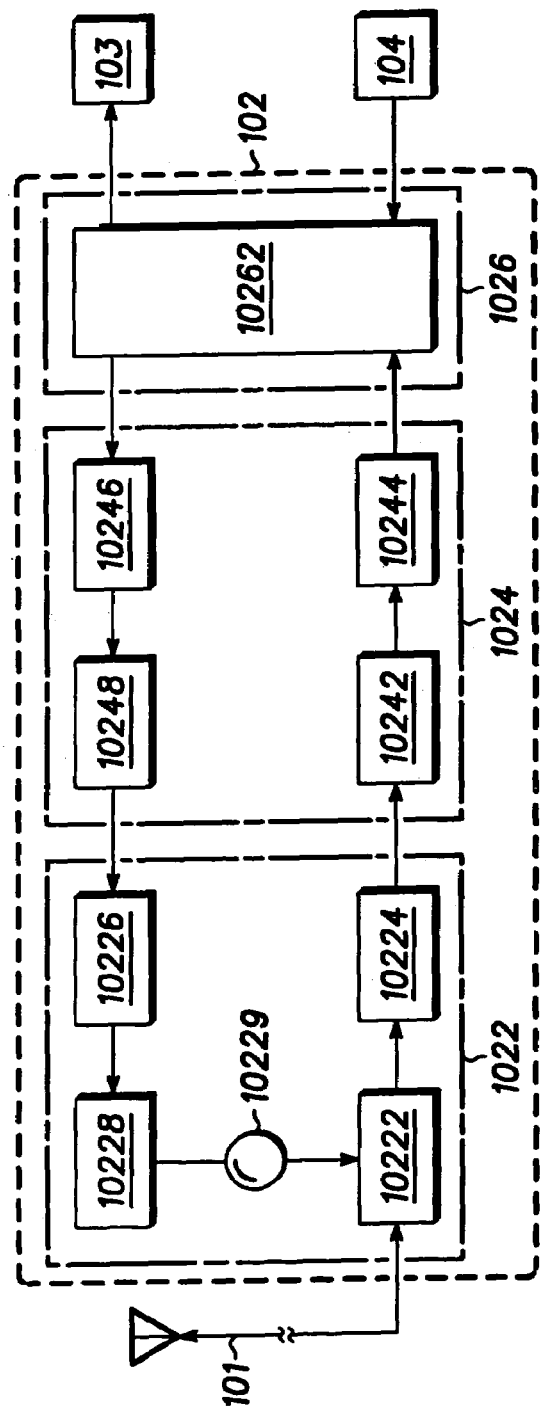
FIG. 6 includes an illustration of a block diagram of a portion of a communicating device.

By way of more specific examples, other integrated circuits and systems are illustrated in FIGS. 6–18. FIG. 6 includes a simplified block diagram illustrating a portion of a communicating device 100 having a signal transceiving means 101., an integrated circuit 102, an output unit 103, and an input unit 104. Examples of the signal transceiving means include an antenna, a modem, or any other means by which information or data can be sent either to or from an external unit. As used herein, transceiving is used to denote that the signal transceiving means may be capable of only receiving, only transmitting, or both receiving and transmitting signals from or to the communicating device. The output unit 103 can include a display, a monitor, a speaker, or the like. The input unit can include a microphone, a keyboard, or the like. Note that in alternative embodiments the output unit 103 and input unit 104 could be replaced by a single unit such as a memory, or the like. The memory can include random access memory or nonvolatile memory, such as a hard disk, a flash memory card or module, or the like.

An integrated circuit is generally a combination of at least two circuit elements (e.g., transistors, diodes, resistors, capacitors, and the like) inseparably associated on or within a continuous substrate. The integrated circuit 102 includes a compound semiconductor portion 1022, a bipolar portion 1024, and an MOS portion 1026. The compound semiconductor portion 1022 includes electrical components that are formed at least partially within a compound semiconductor material. Transistors and other electrical components within the compound semiconductor portion 1022 are capable of processing signals at radio frequencies of at least approximately 0.8 GHz. In other embodiments, the signals could be at lower or higher frequencies. For example, some materials, such as indium gallium arsenide, are capable of processing signals at radio frequency signals at approximately 27 GHz.

The compound semiconductor portion 1022 further includes a duplexer 10222, a radio frequency-to-baseband converter 10224 (demodulating means or demodulating circuit), baseband-to-radio frequency converter 10226 (modulating means or modulating circuit), a power amplifier 10228, and an isolator 10229. The bipolar portion 1024 and the MOS portion 1026 typically are formed in a Group IV semiconductive material. The bipolar portion 1024 includes a receiving amplifier 10242, an analog-to-digital converter 10244, a digital-to-analog converter 10246, and a transmitting amplifier 10248. The MOS portion 1026 includes a digital signal processing means 10262. An example of such means includes any one of the commonly available DSP cores available in the market, such as the Motorola DSP 566xx (from Motorola, Incorporated of Schaumburg, Ill.) and Texas Instruments TMS 320C54x (from Texas Instruments of Dallas, Tex.) families of digital signal processors. This digital signal processing means 10262 typically includes complementary MOS (CMOS) transistors and analog-to-digital and digital-to-analog converters. Clearly, other electrical components are present in the integrated circuit 102.

In one mode of operation, the communicating device 100 receives a signal from an antenna, which is part of the signal transceiving means 101. The signal passes through the duplexer 10227 to the radio frequency-to-baseband converter 10224. The analog data or other information is amplified by receiving amplifier 10224 and transmitted to the digital signal processing means 10262. After the digital signal processing means 10262 has processed the information or other data, the processed information or other data is transmitted to the output unit 103. If the communicating device is a pager, the output unit can be a display. If the communicating device is a cellular telephone, the output unit 103 can include a speaker, a display, or both.

Data or other information can be sent through the communicating device 100 in the opposite direction. The data or other information will come in through the input unit 104. In a cellular telephone, this could include a microphone or a keypad. The information or other data is then processed using the digital signal processing means 10262. After processing, the signal is then converted using the digital-to-analog converter 10246. The converted signal is amplified by the transmitting amplifier 10248. The amplified signal is modulated by the baseband-to-radio frequency converter 10226 and further amplified by power amplifier 10228. The amplified RF signal passes through the isolator 10229 and duplexer 10222 to the antenna.

Prior art embodiments of the communicating device 100 would have at least two separate integrated circuits: one for the compound semiconductor portion 1022 and one for the MOS portion 1026. The bipolar portion 1024 may be on the same integrated circuit as the MOS portion 1026 or could be on still another integrated circuit. With an embodiment of the present invention, all three portions can now be formed within a single integrated circuit. Because all of the transistors can reside on a single integrated circuit, the communicating device can be greatly miniaturized and allow for greater portability of a communicating device.

Figure 7:
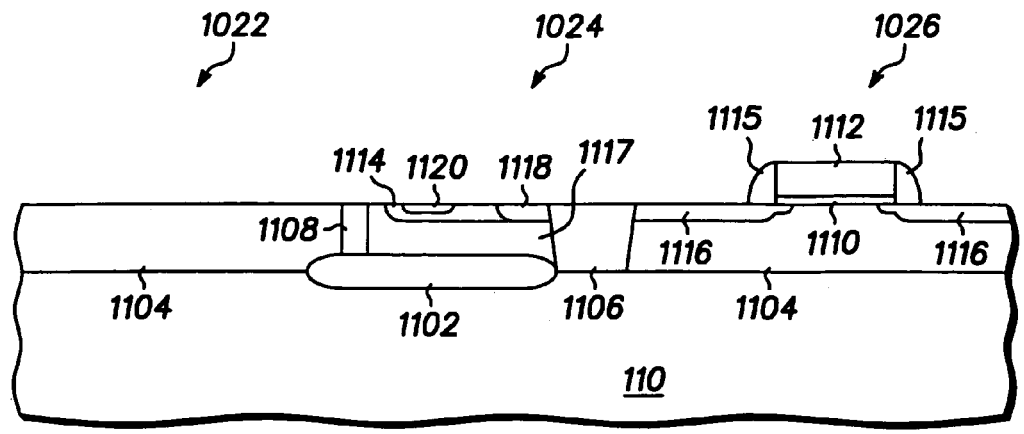
FIGS. 7–11 include illustrations of cross-sectional views of a portion of an integrated circuit that includes a compound semiconductor portion, a bipolar portion, and an MOS portion.

Attention is now directed to a method for forming exemplary portions of the integrated circuit 102 as illustrated in FIGS. 7–11. In FIG. 7, a p-type doped, monocrystalline silicon substrate 110 is provided having a compound semiconductor portion 1022, a bipolar portion 1024, and an MOS portion 1026. Within the bipolar portion, the monocrystalline silicon substrate is doped to form an $N^+$ buried region 1102. A lightly p-type doped epitaxial monocrystalline silicon layer 1104 is then formed over the buried region 1102 and the substrate 110. A doping step is then performed to create a lightly n-type doped drift region 1117 above the $N^+$ buried region 1102. The doping step converts the dopant type of the lightly p-type epitaxial layer within a section of the bipolar region 1024 to a lightly n-type monocrystalline silicon region. A field isolation region 1106 is then formed between the bipolar portion 1024 and the MOS portion 1026. A gate dielectric layer 1110 is formed over a portion of the epitaxial layer 1104 within MOS portion 1026, and the gate electrode 1112 is then formed over the gate dielectric layer 1110. Sidewall spacers 1115 are formed along vertical sides of the gate electrode 1112 and gate dielectric layer 1110.

A p-type dopant is introduced into the drift region 1117 to form an active or intrinsic base region 1114. An n-type, deep collector region 1108 is then formed within the bipolar portion 1024 to allow electrical connection to the buried region 1102. Selective n-type doping is performed to form $N^+$ doped regions 1116 and the emitter region 1120. $N^+$ doped regions 1116 are formed within layer 1104 along adjacent sides of the gate electrode 1112 and are source, drain, or source/drain regions for the MOS transistor. The $N^+$ doped regions 1116 and emitter region 1120 have a doping concentration of at least 1E19 atoms per cubic centimeter to allow ohmic contacts to be formed. A p-type doped region is formed to create the inactive or extrinsic base region 1118 which is a $P^+$ doped region (doping concentration of at least 1E19 atoms per cubic centimeter).

In the embodiment described, several processing steps have been performed but are not illustrated or further described, such as the formation of well regions, threshold adjusting implants, channel punchthrough prevention implants, field punchthrough prevention implants, as well as a variety of masking layers. The formation of the device up to this point in the process is performed using conventional steps. As illustrated, a standard N-channel MOS transistor has been formed within the MOS region 1026, and a vertical NPN bipolar transistor has been formed within the bipolar portion 1024. As of this point, no circuitry has been formed within the compound semiconductor portion 1022.

All of the layers that have been formed during the processing of the bipolar and MOS portions of the integrated circuit are now removed from the surface of compound semiconductor portion 1022. A bare silicon surface is thus provided for the subsequent processing of this portion, for example in the manner set forth above.

Figure 8:
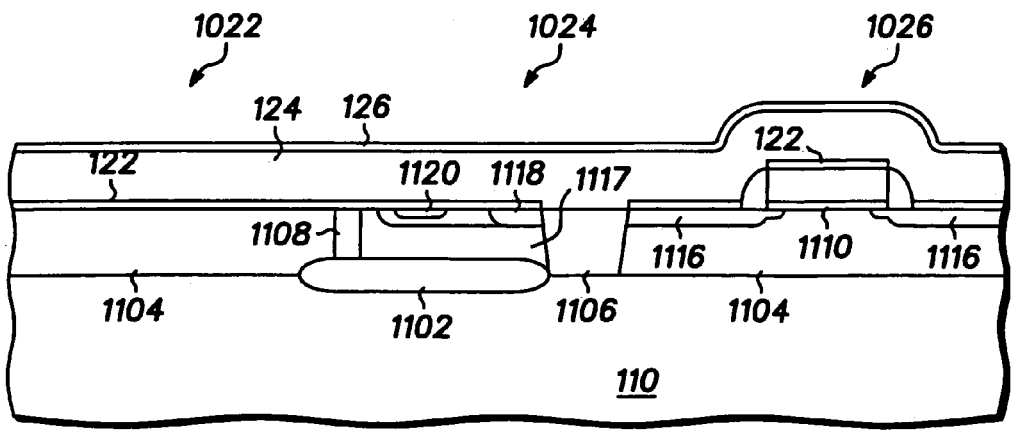

An accommodating buffer layer 124 is then formed over the substrate 110 as illustrated in FIG. 8. The accommodating buffer layer will form as a monocrystalline layer over the properly prepared (i.e., having the appropriate template layer) bare silicon surface in portion 1022. The portion of layer 124 that forms over portions 1024 and 1026, however, may be polycrystalline or amorphous because it is formed over a material that is not monocrystalline, and therefore, does not nucleate monocrystalline growth. The accommodating buffer layer 124 typically is a monocrystalline metal oxide or nitride layer and typically has a thickness in a range of approximately 2–100 nanometers. In one particular embodiment, the accommodating buffer layer is approximately 5–15 nm thick. During the formation of the accommodating buffer layer, an amorphous intermediate layer 122 is formed along the uppermost silicon surfaces of the integrated circuit 102. This amorphous intermediate layer 122 typically includes an oxide of silicon and has a thickness and range of approximately 1–5 nm. In one particular embodiment, the thickness is approximately 2 nm. Following the formation of the accommodating buffer layer 124 and the amorphous intermediate layer 122, a template layer 126 is then formed and has a thickness in a range of approximately one to ten monolayers of a material. In one particular embodiment, the material includes titanium-arsenic, strontium-oxygen-arsenic, or other similar materials as previously described with respect to FIGS. 1–5.

Figure 9:
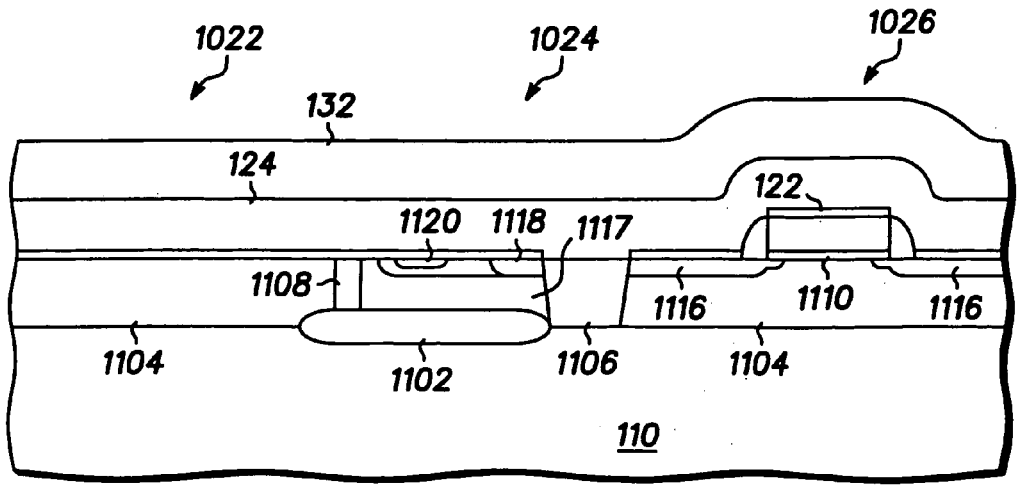

A monocrystalline compound semiconductor layer 132 is then epitaxially grown overlying the monocrystalline portion of accommodating buffer layer 124 as shown in FIG. 9. The portion of layer 132 that is grown over portions of layer 124 that are not monocrystalline may be polycrystalline or amorphous. The monocrystalline compound semiconductor layer can be formed by a number of methods and typically includes a material such as gallium arsenide, aluminum gallium arsenide, indium phosphide, or other compounds semiconductor materials as previously mentioned. The thickness of the layer is in a range of approximately 1–5,000 nm, and more preferably 100–500 nm. In this particular embodiment, each of the elements within the template layer are also present in the accommodating buffer layer 124, the monocrystalline compound semiconductor material 132, or both. Therefore, the delineation between the template layer 126 and its two immediately adjacent layers disappears during processing. Therefore, when a transmission electron microscopy (TEM) photograph is taken, an interface between the accommodating buffer layer 124 and the monocrystalline compound semiconductor layer 132 is seen.

Figure 10:
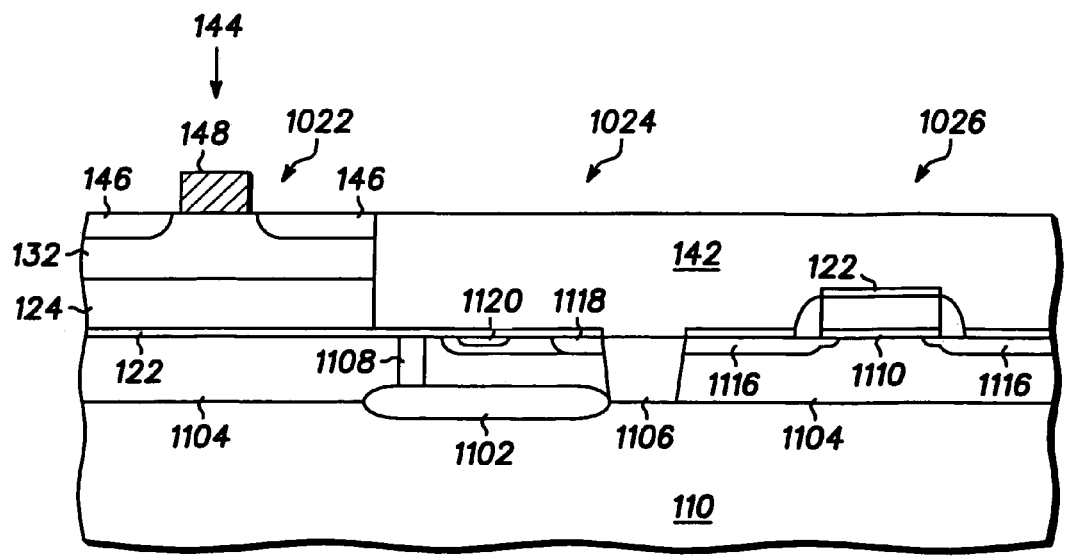

At this point in time, sections of the compound semiconductor layer 132 and the accommodating buffer layer 124 are removed from portions overlying the bipolar portion 1024 and the MOS portion 1026 as shown in FIG. 10. After the section is removed, an insulating layer 142 is then formed over the substrate 110. The insulating layer 142 can include a number of materials such as oxides, nitrides, oxynitrides, low-k dielectrics, or the like. As used herein, low-k is a material having a dielectric constant no higher than approximately 3.5. After the insulating layer 142 has been deposited, it is then polished, removing portions of the insulating layer 142 that overlie monocrystalline compound semiconductor layer 132.

A transistor 144 is then formed within the monocrystalline compound semiconductor portion 1022. A gate electrode 148 is then formed on the monocrystalline compound semiconductor layer 132. Doped regions 146 are then formed within the monocrystalline compound semiconductor layer 132. In this embodiment, the transistor 144 is a metal-semiconductor field-effect transistor (MESFET). If the MESFET is an n-type MESFET, the doped regions 146 and monocrystalline compound semiconductor layer 132 are also n-type doped. If a p-type MESFET were to be formed, then the doped regions 146 and monocrystalline compound semiconductor layer 132 would have just the opposite doping type. The heavier doped (N) regions 146 allow ohmic contacts to be made to the monocrystalline compound semiconductor layer 132. At this point in time, the active devices within the integrated circuit have been formed. This particular embodiment includes an n-type MESFET, a vertical NPN bipolar transistor, and a planar n-channel MOS transistor. Many other types of transistors, including P-channel MOS transistors, p-type vertical bipolar transistors, p-type MESFETs, and combinations of vertical and planar transistors, can be used. Also, other electrical components, such as resistors, capacitors, diodes, and the like, may be formed in one or more of the portions 1022, 1024, and 1026.

Figure 11:
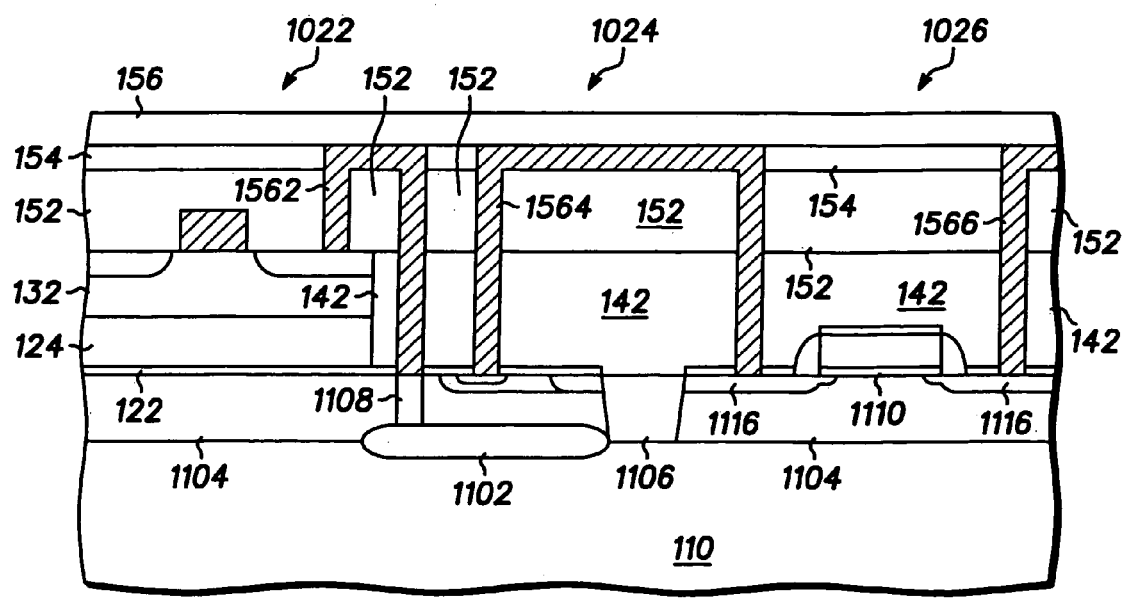

Processing continues to form a substantially completed integrated circuit 102 as illustrated in FIG. 11. An insulating layer 152 is formed over the substrate 110. The insulating layer 152 may include an etch-stop or polish-stop region that is not illustrated in the FIG. 11. A second insulating layer 154 is then formed over the first insulating layer 152. Portions of layers 154, 152, 142, 124, and 122 are removed to define contact openings where the devices are to be interconnected. Interconnect trenches are formed within insulating layer 154 to provide the lateral connections between the contacts. As illustrated in FIG. 11, interconnect 1562 connects a source or drain region of the n-type MESFET within portion 1022 to the deep collector region 1108 of the NPN transistor within the bipolar portion 1024. The emitter region 1120 of the NPN transistor is connected to one of the doped regions 1116 of the n-channel MOS transistor within the MOS portion 1026. The other doped region 1116 is electrically connected to other portions of the integrated circuit that are not shown.

A passivation layer 156 is formed over the interconnects 1562, 1564, and 1566 and insulating layer 154. Other electrical connections are made to the transistors as illustrated as well as to other electrical or electronic components within the integrated circuit 102 but are not illustrated in the figures. Further, additional insulating layers and interconnects may be formed as necessary to form the proper interconnections between the various components within the integrated circuit 102.

As can be seen from the previous embodiment, active devices for both compound semiconductor and Group IV semiconductor materials can be integrated into a single integrated circuit. Because there is some difficulty in incorporating both bipolar transistors and MOS transistors within a same integrated circuit, it may be possible to move some of the components within bipolar portion into the compound semiconductor portion 1022 or the MOS portion 1024. More specifically, turning to the embodiment as described with respect to FIG. 6, the amplifiers 10248 and 10242 may be moved over to the compound semiconductor portion 1022, and the converters 10244 and 10246 can be moved over into the MOS portion 1026. Therefore, the requirement of special fabricating steps solely used for making a bipolar transistor can be eliminated. Therefore, there would only be a compound semiconductor portion and a MOS portion to the integrated circuit.

In still another embodiment, an integrated circuit can be formed such that it includes an optical laser in a compound semiconductor portion and an optical interconnect (waveguide) to an MOS transistor within a Group IV semiconductor region of the same integrated circuit. FIGS. 12–18 include illustrations of one embodiment.

Figure 12:
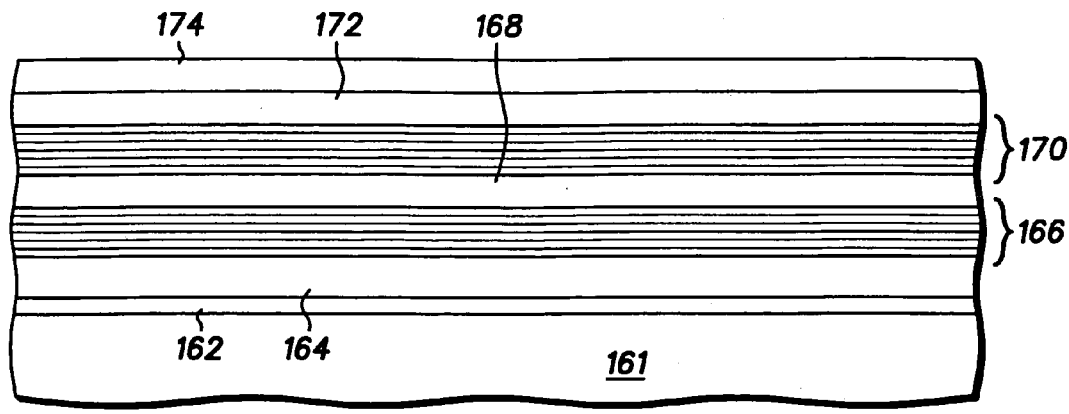
FIGS. 12–18 includes illustrations of cross-sectional views of a portion of another integrated circuit that includes a semiconductor laser and an MOS transistor.

FIG. 12 includes an illustration of a cross-section view of a portion of an integrated circuit 160 that includes a monocrystalline silicon wafer 161. An amorphous intermediate layer 162 and an accommodating buffer layer 164, similar to those previously described, have been formed over wafer 161. In this specific embodiment, the layers needed to form the optical laser will be formed first, followed by the layers needed for the MOS transistor. In FIG. 12, the lower mirror layer 166 includes alternating layers of compound semiconductor materials. For example, the first, third, and fifth films within the optical laser may include a material such as gallium arsenide, and the second, fourth, and sixth films within the lower mirror layer 166 may include aluminum gallium arsenide or vice versa. Layer 168 includes the active region that will be used for photon generation. Upper mirror layer 170 is formed in a similar manner to the lower mirror layer 166 and includes alternating films of compound semiconductor materials. In one particular embodiment, the upper mirror layer 170 may be p-type doped compound semiconductor materials, and the lower mirror layer 166 may be n-type doped compound semiconductor materials.

Another accommodating buffer layer 172, similar to the accommodating buffer layer 164, is formed over the upper mirror layer 170. In an alternative embodiment, the accommodating buffer layers 164 and 172 may include different materials. However, their function is essentially the same in that each is used for making a transition between a compound semiconductor layer and a monocrystalline Group IV semiconductor layer. A monocrystalline Group IV semiconductor layer 174 is formed over the accommodating buffer layer 172. In one particular embodiment, the monocrystalline Grout IV semiconductor layer 174 includes germanium, silicon germanium, silicon germanium carbide, or the like.

Figure 13:
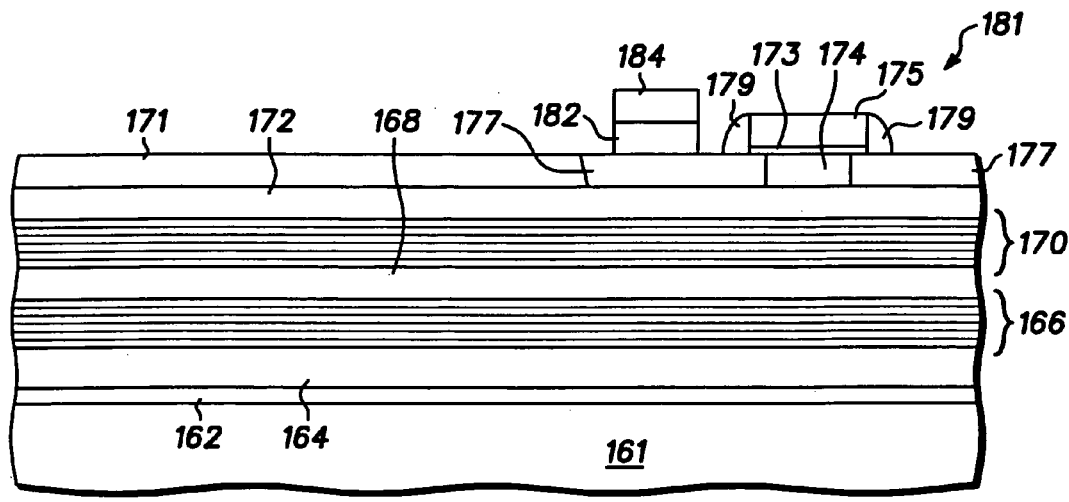

In FIG. 13, the MOS portion is processed to form electrical components within this upper monocrystalline Group IV semiconductor layer 174. As illustrated in FIG. 13, a field isolation region 171 is formed from a portion of layer 174. A gate dielectric layer 173 is formed over the layer 174, and a gate electrode 175 is formed over the gate dielectric layer 173. Doped regions 177 are source, drain, or source/drain regions for the transistor 181, as shown. Sidewall spacers 179 are formed adjacent to the vertical sides of the gate electrode 175. Other components can be made within at least a part of layer 174. These other components include other transistors (n-channel or p-channel), capacitors, transistors, diodes, and the like.

A monocrystalline Group IV semiconductor layer is epitaxially grown over one of the doped regions 177. An upper portion 184 is P+ doped, and a lower portion 182 remains substantially intrinsic (undoped) as illustrated in FIG. 13. The layer can be formed using a selective epitaxial process. In one embodiment, an insulating layer (not shown) is formed over the transistor 181 and the field isolation region 171. The insulating layer is patterned to define an opening that exposes one of the doped regions 177. At least initially, the selective epitaxial layer is formed without dopants. The entire selective epitaxial layer may be intrinsic, or a p-type dopant can be added near the end of the formation of the selective epitaxial layer. If the selective epitaxial layer is intrinsic, as formed, a doping step may be formed by implantation or by furnace doping. Regardless how the P+ upper portion 184 is formed, the insulating layer is then removed to form the resulting structure shown in FIG. 13.

Figure 14:
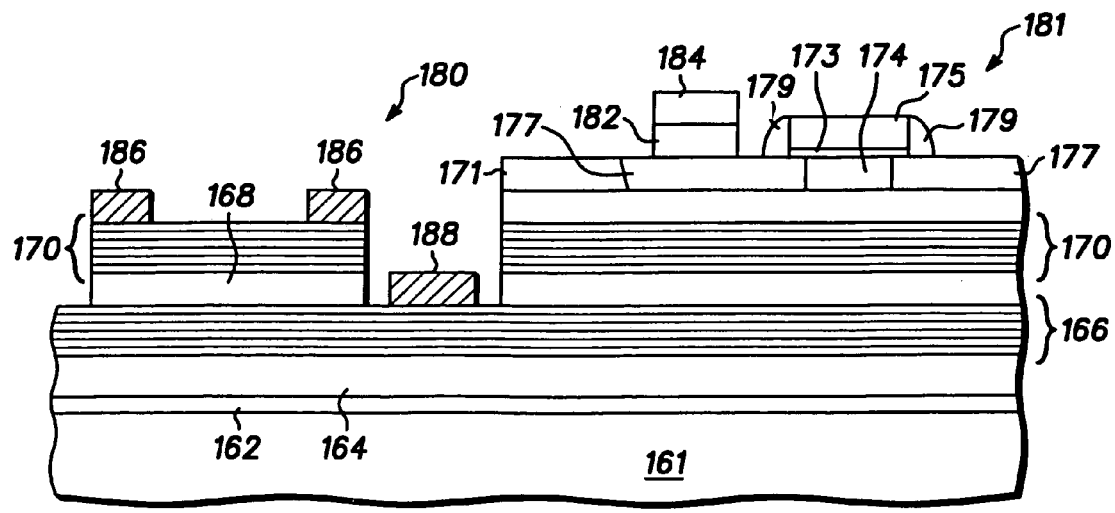

The next set of steps is performed to define the optical laser 180 as illustrated in FIG. 14. The field isolation region 171 and the accommodating buffer layer 172 are removed over the compound semiconductor portion of the integrated circuit. Additional steps are performed to define the upper mirror layer 170 and active layer 168 of the optical laser 180. The sides of the upper mirror layer 170 and active layer 168 are substantially coterminous.

Contacts 186 and 188 are formed for making electrical contact to the upper mirror layer 170 and the lower mirror layer 166, respectively, as shown in FIG. 14. Contact 186 has an annular shape to allow light (photons) to pass out of the upper mirror layer 170 into a subsequently formed optical waveguide.

Figure 15:
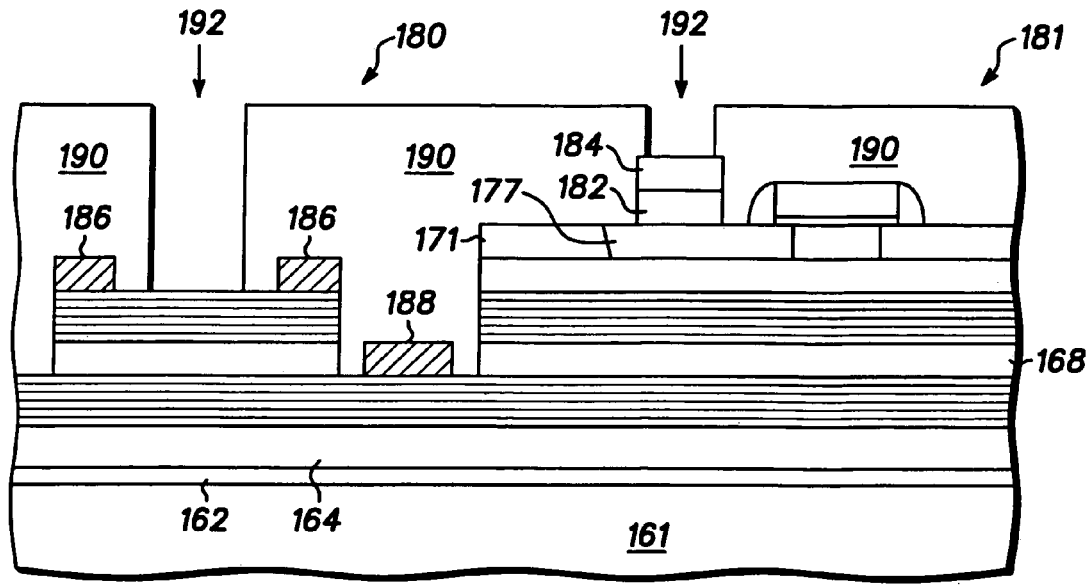
Figure 16:
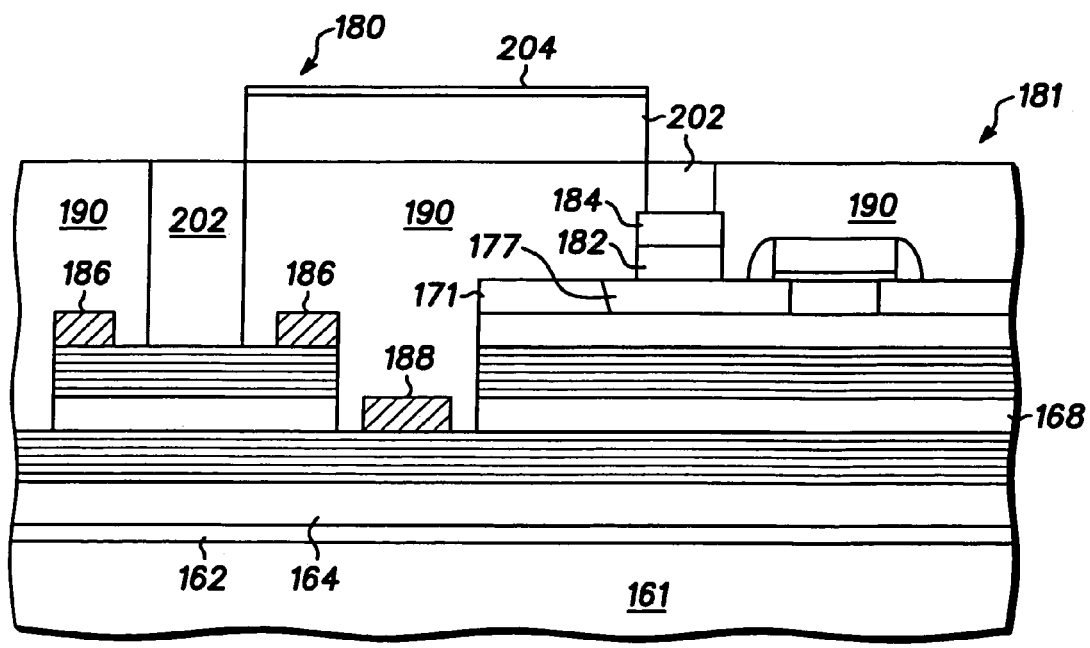

An insulating layer 190 is then formed and patterned to define optical openings extending to the contact layer 186 and one of the doped regions 177 as shown in FIG. 15. The insulating material can be any number of different materials, including an oxide, nitride, oxynitride, low-k dielectric, or any combination thereof. After defining the openings 192, a higher refractive index material 202 is then formed within the openings to fill them and to deposit the layer over the insulating layer 190 as illustrated in FIG. 16. With respect to the higher refractive index material 202, "higher" is in relation to the material of the insulating layer 190 (i.e., material 202 has a higher refractive index compared to the insulating layer 190). Optionally, a relatively thin lower refractive index film (not shown) could be formed before forming the higher refractive index material 202. A hard mask layer 204 is then formed over the high refractive index layer 202. Portions of the hard mask layer 204, and high refractive index layer 202 are removed from portions overlying the opening and to areas closer to the sides of FIG. 16.

Figure 17:
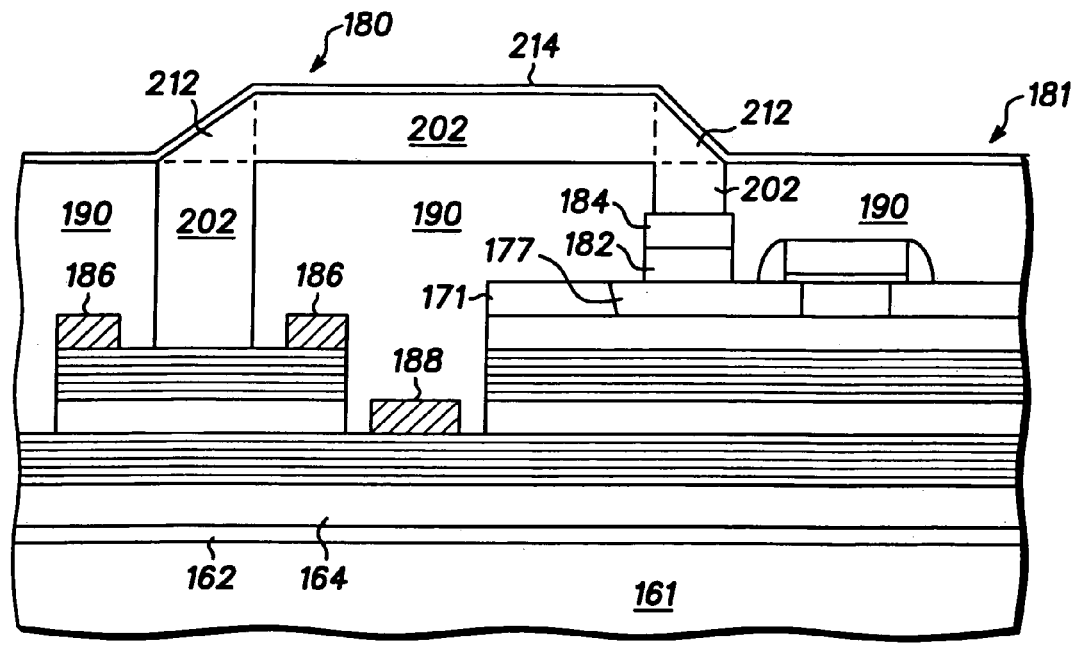

The balance of the formation of the optical waveguide, which is an optical interconnect, is completed as illustrated in FIG. 17. A deposition procedure (possibly a dep-etch process) is performed to effectively create sidewalls sections 212. In this embodiment, the sidewall sections 212 are made of the same material as material 202. The hard mask layer 204 is then removed, and a low refractive index layer 214 (low relative to material 202 and layer 212) is formed over the higher refractive index material 212 and 202 and exposed portions of the insulating layer 190. The dash lines in FIG. 17 illustrate the border between the high refractive index materials 202 and 212. This designation is used to identify that both are made of the same material but are formed at different times.

Figure 18:
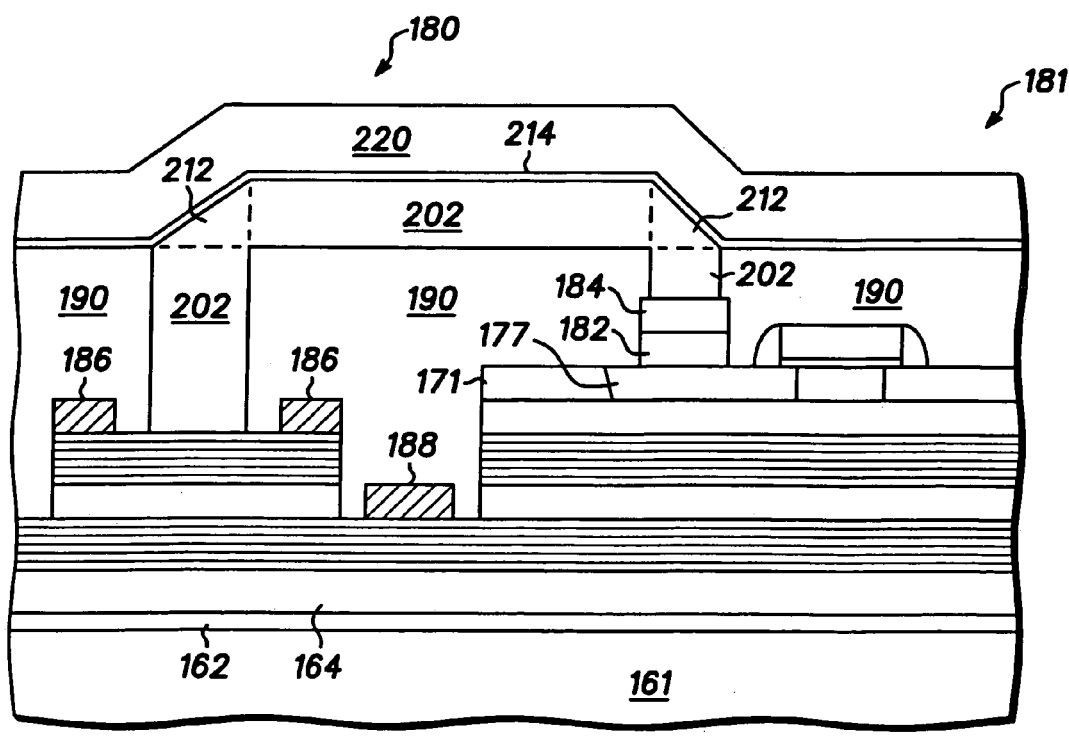

Processing is continued to form a substantially completed integrated circuit as illustrated in FIG. 18. A passivation layer 220 is then formed over the optical laser 180 and MOSFET transistor 181. Although not shown, other electrical or optical connections are made to the components within the integrated circuit but are not illustrated in FIG. 18. These interconnects can include other optical waveguides or may include metallic interconnects.

In other embodiments, other types of lasers can be formed. For example, another type of laser can emit light (photons) horizontally instead of vertically. If light is emitted horizontally, the MOSFET transistor could be formed within the substrate 161, and the optical waveguide would be reconfigured, so that the laser is properly coupled (optically connected) to the transistor. In one specific embodiment, the optical waveguide can include at least a portion of the accommodating buffer layer. Other configurations are possible.

Clearly, these embodiments of integrated circuits having compound semiconductor portions and Group IV semiconductor portions, are meant to illustrate embodiments of the present invention and not limit the present invention. There are multiplicity of other combinations and other embodiments of the present invention. For example, the compound semiconductor portion may include light emitting diodes, photodetectors, diodes, or the like, and the Group IV semiconductor can include digital logic, memory arrays, and most structures that can be formed in conventional MOS integrated circuits. By using embodiments of the present invention, it is now simpler to integrate devices that work better in compound semiconductor materials with other components that work better in Group IV semiconductor materials. This allows a device to be shrunk, the manufacturing costs to decrease, and yield and reliability to increase.

Although not illustrated, a monocrystalline Group IV wafer can be used in forming only compound semiconductor electrical components over the wafer. In this manner, the wafer is essentially a "handle" wafer used during the fabrication of the compound semiconductor electrical components within a monocrystalline compound semiconductor layer overlying the wafer. Therefore, electrical components can be formed within III–V or II–VI semiconductor materials over a wafer of at least approximately 200 millimeters in diameter and possibly at least approximately 300 millimeters.

By the use of this type of substrate, a relatively inexpensive "handle" wafer overcomes the fragile nature of the compound semiconductor wafers by placing them over a relatively more durable and easy to fabricate base material. Therefore, an integrated circuit can be formed such that all electrical components, and particularly all active electronic devices, can be formed within the compound semiconductor material even though the substrate itself may include a Group IV semiconductor material. Fabrication costs for compound semiconductor device should decrease because larger substrates can be processed more economically and more readily compared to the relatively smaller and more fragile, conventional compound semiconductor wafers.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor structure comprising:
   a monocrystalline silicon substrate;
   an amorphous oxide material in contact with the monocrystalline silicon substrate;
   a monocrystalline metal oxide selected from the group consisting of alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, gadolinium oxide and mixtures thereof contacting the amorphous oxide material; and
   a monocrystalline compound semiconductor material overlying the monocrystalline metal oxide.

2. The semiconductor structure of claim 1 wherein the monocrystalline silicon substrate is orientated in the (100) direction.

3. The semiconductor structure of claim 1 further comprising a template layer formed between the monocrystalline metal oxide and the monocrystalline compound semiconductor material.

4. The semiconductor structure of claim 1 further comprising a buffer material of monocrystalline semiconductor material formed between the monocrystalline metal oxide and the monocrystalline compound semiconductor material.

5. The semiconductor structure of claim 4 further comprising a template layer formed between the monocrystalline metal oxide and the buffer material.

6. The semiconductor structure of claim 4 wherein the buffer material is selected from the group consisting of. Germanium, a $GaAs_xP_{1-x}$, superlattice where x ranges from 0 to 1, an $In_yGa_{1-y}P$ superlattice where y ranges from 0 to 1, and an InGaAs superlattice.

7. The semiconductor structure of claim 1 wherein the monocrystalline metal oxide comprises $Sr_zBa_{1-z}TiO_3$ wherein z ranges from 0 to 1.

8. The semiconductor structure of claim 1 wherein the monocrystalline compound semiconductor material is selected from the group consisting of: III–V compounds, mixed III-V compounds, II–VI compounds, and mixed II-VI compounds.

9. The semiconductor structure of claim 1 wherein the monocrystalline compound semiconductor material is selected from the group consisting of: GaAs, AlGaAS, Inp, InGaAs, InGaP, ZnSe, AlInAs, CdS, CdHgTe, and ZnSeS.

* * * * *